United States Patent
Ishida et al.

(10) Patent No.: US 9,559,449 B2
(45) Date of Patent: Jan. 31, 2017

(54) PRINTED WIRING BOARD AND CONNECTOR CONNECTING THE WIRING BOARD

(71) Applicants: FUJIKURA LTD., Tokyo (JP); DDK LTD., Tokyo (JP)

(72) Inventors: Yuki Ishida, Kohtoh-ku (JP); Masayuki Suzuki, Kohtoh-ku (JP); Yuki Nakano, Kohtoh-ku (JP); Harunori Urai, Kohtoh-ku (JP); Norifumi Nagae, Kohtoh-ku (JP)

(73) Assignees: FUJIKURA LTD., Tokyo (JP); DDK Ltd., Tokyo (JP)

( * ) Notice: Subject to any disclaimer, the term of this patent is extended or adjusted under 35 U.S.C. 154(b) by 0 days.

(21) Appl. No.: 14/916,473

(22) PCT Filed: Sep. 4, 2014

(86) PCT No.: PCT/JP2014/073378
§ 371 (c)(1),
(2) Date: Mar. 3, 2016

(87) PCT Pub. No.: WO2015/034017
PCT Pub. Date: Mar. 12, 2015

(65) Prior Publication Data
US 2016/0204531 A1 Jul. 14, 2016

(30) Foreign Application Priority Data
Sep. 5, 2013 (JP) ................................ 2013-184072

(51) Int. Cl.
*H01R 12/73* (2011.01)
*H05K 1/11* (2006.01)
(Continued)

(52) U.S. Cl.
CPC .............. *H01R 12/73* (2013.01); *H01R 12/77* (2013.01); *H01R 12/88* (2013.01); *H05K 1/111* (2013.01);
(Continued)

(58) Field of Classification Search
CPC ......... H01R 12/72; H01R 12/71; H01R 12/73; H01R 12/75; H01R 12/77; H05K 1/117
See application file for complete search history.

(56) References Cited

U.S. PATENT DOCUMENTS 6,089,905 A * 7/2000 Shimmyo .............. H01R 12/79
439/260
7,306,478 B2 * 12/2007 Kudo ................... H01R 12/771
439/494
(Continued)

FOREIGN PATENT DOCUMENTS

EP 1 109 258 A2 6/2001
EP 2879240 A2 * 6/2015 ............. H01R 12/53
(Continued)

OTHER PUBLICATIONS

Decision of Refusal of Japanese Patent Application No. 2013-184072, dated Mar. 4, 2015.
(Continued)

*Primary Examiner* — Briggitte R Hammond
(74) *Attorney, Agent, or Firm* — Sughrue Mion, PLLC

(57) ABSTRACT

A printed wiring board (1) includes: a base substrate (3); a plurality of pads (15a, 17a) for electrical connection that are disposed at one surface side of the base substrate (3) and at a connection end portion (13) to be connected with another electronic component (50); wirings (9, 11) that are connected with the pads (15a, 17a); and engageable parts (28, 29) that are formed at side edge parts of the connection end portion (13) and are to be engaged with engagement parts (58) of the other electronic component (50) in the direction of disconnection. The flexible printed wiring board (1) further includes: reinforcement layers (31, 32) that are disposed at the one surface side of the base substrate (3) and at a frontward side with respect to the engageable parts (28, 29) when viewed in the direction of connection with the
(Continued)

other electronic component and that are formed integrally with the pads (15a); and insulating layers (34, 35) that cover the reinforcement layers (31, 32).

2 Claims, 20 Drawing Sheets

(51) Int. Cl.
H01R 12/77 (2011.01)
H01R 12/88 (2011.01)

(52) U.S. Cl.
CPC ..... *H05K 1/117* (2013.01); *H05K 2201/09036* (2013.01); *H05K 2201/09063* (2013.01); *H05K 2201/09409* (2013.01); *H05K 2201/10189* (2013.01)

(56) References Cited

U.S. PATENT DOCUMENTS

| | | | | |
|---|---|---|---|---|
| 7,367,838 | B2* | 5/2008 | Takahashi | H01R 43/007 439/495 |
| 7,628,618 | B2* | 12/2009 | Wang | H01R 12/88 439/495 |
| 8,851,918 | B2* | 10/2014 | Yoshisuji | H01R 13/639 439/260 |
| 2002/0027634 | A1 | 3/2002 | Kang et al. | |
| 2007/0197104 | A1* | 8/2007 | Nagawatari | H01R 12/79 439/751 |
| 2008/0137277 | A1* | 6/2008 | Mundt | H01R 13/5829 361/679.01 |
| 2009/0107699 | A1 | 4/2009 | Ryu | |

FOREIGN PATENT DOCUMENTS

| | | |
|---|---|---|
| JP | 58-133957 U | 9/1983 |
| JP | 64-16083 U | 1/1989 |
| JP | 1-260884 A | 10/1989 |
| JP | 2-120863 U | 9/1990 |
| JP | 3-61366 U | 6/1991 |
| JP | 6-42362 Y2 | 11/1994 |
| JP | 2000-30784 A | 1/2000 |
| JP | 2001-177206 A | 6/2001 |
| JP | 2002-56931 A | 2/2002 |
| JP | 2007-227036 A | 9/2007 |
| JP | 2007-318040 A | 12/2007 |
| JP | 2008-91363 A | 4/2008 |
| JP | 2009-80972 A | 4/2009 |
| TW | 1286629 B | 9/2007 |
| TW | 1299224 B | 7/2008 |
| TW | 201242180 A1 | 10/2012 |
| TW | 1383717 B1 | 1/2013 |

OTHER PUBLICATIONS

Notification of Reasons for Refusal for Japanese Patent Application No. 2013-184072, dated Aug. 22, 2014.
Report of Reconsideration by Examiner before Appeal of Japanese Patent Application No. 2013-184072, dated Sep. 29, 2015.
International Search Report of PCT/JP2014/073378, dated Sep. 30, 2014. [PCT/ISA/210].
Written Opinion of PCT/JP2014/073378, dated Sep. 30, 2014. [PCT/ISA/210].
Communication dated Mar. 8, 2016, issued by the Japan Patent Office in corresponding Japanese Application No. 2013-184072.
Communication dated Aug. 24, 2016, issued by the Intellectual Property Office of Taiwan in corresponding Taiwanese Application No. 103130710.

* cited by examiner (a)

(b)

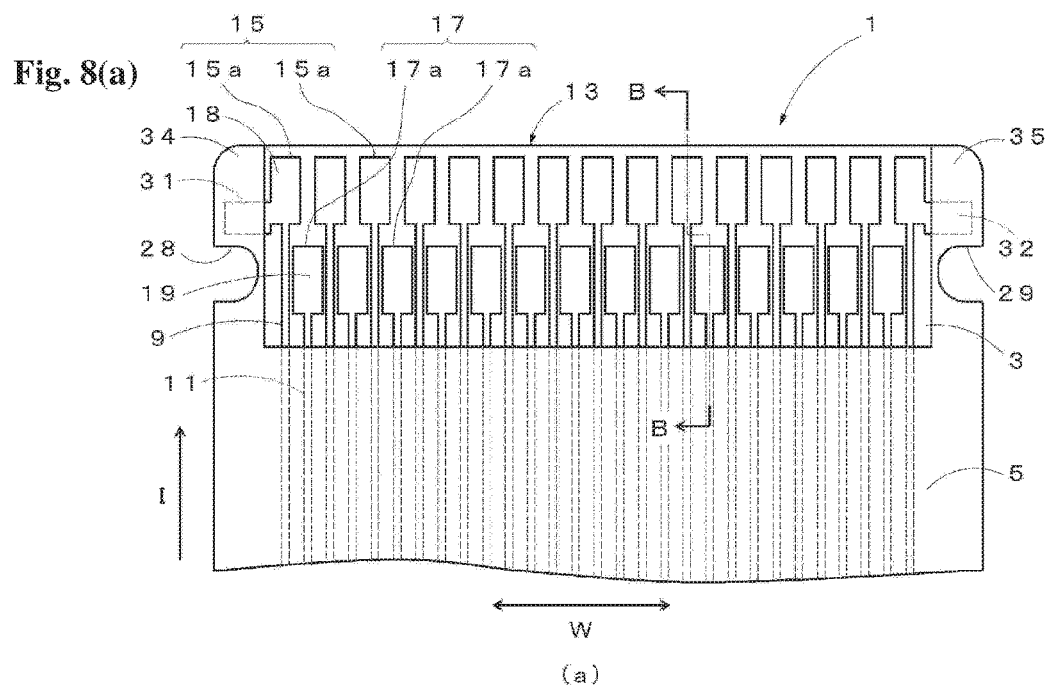

(a)

(b)

(a)

(b)

(c)

(d)

(a)

(b)

(a)

(b)

(a)

(b)

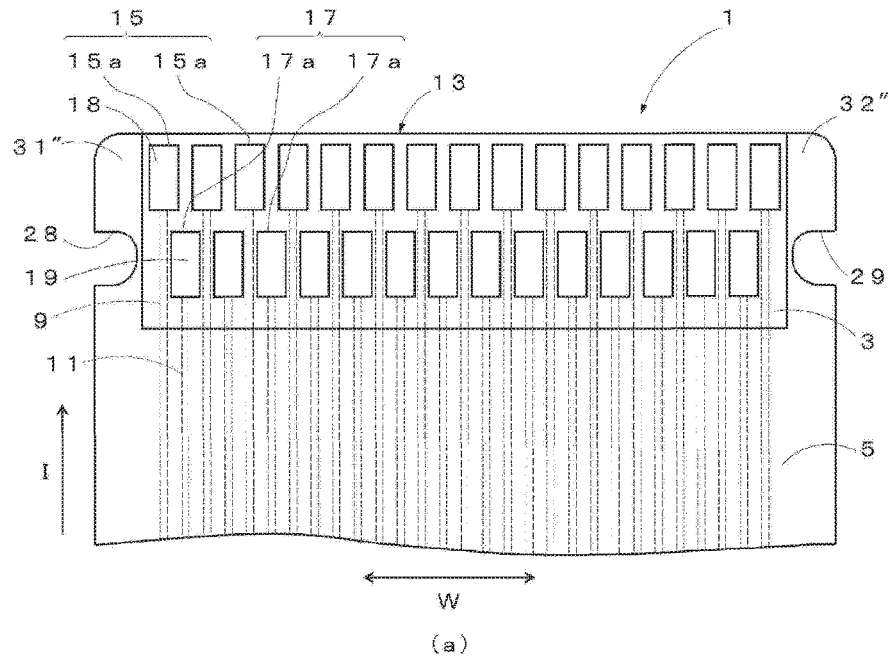
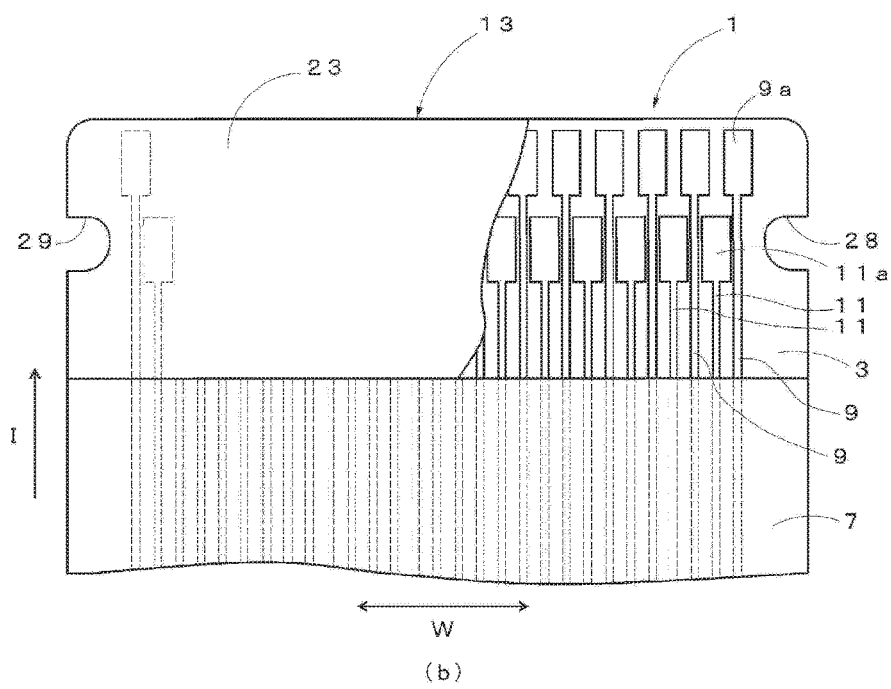

(a)

(b)

(a)

(b)

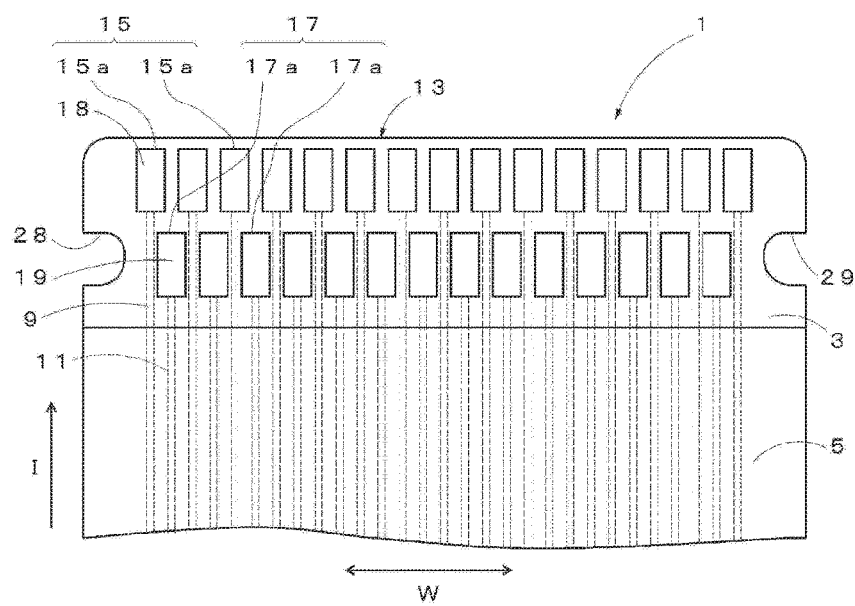

PRINTED WIRING BOARD AND CONNECTOR CONNECTING THE WIRING BOARD

CROSS REFERENCE TO RELATED APPLICATIONS

This application is a National Stage of International Application No. PCT/JP2014/073378 filed Sep. 4, 2014, claiming priority based on Japanese Patent Application No. 2013-184072, filed Sep. 5, 2013, the contents of all of which are incorporated herein by reference in their entirety.

TECHNICAL FIELD

The present invention relates to a printed wiring board having pads for electrical connection at a connection end portion to be connected with another electronic component, such as a connector, and also relates to a connector that connects the printed wiring board with another wiring board.

BACKGROUND ART

Printed wiring boards are used for connection between electronic components in electronic devices, such as digital cameras, digital video camcorders, notebook-sized personal computers, cellular phones, and game machines. In accordance with reduction in weight, thickness and size of such electronic devices, it is also required to make printed wiring boards thin and small in themselves. However, if a printed wiring board is made thin and small, the holding force given by a connector to the connection end portion will be weak, and troubles may possibly occur, including that the printed wiring board is disconnected from the connector and contact failure occurs during implementation such as due to reaction forces in wiring and impact of dropping or the like.

To prevent such disconnection of a printed wiring board, Patent Document 1 below describes providing notches at locations opposite to each other at a pair of parallel sides of a flexible printed wiring board, and fitting engagement parts provided on a connector into the notches thereby to hold the flexible printed wiring board in the housing of the connector.

PRIOR ART DOCUMENT

Patent Document

[Patent Document 1] JP 2009-80972 A

SUMMARY OF INVENTION

Problems to be Solved by Invention

In the disclosure of the above Patent Document 1, however, the sides formed with the notches are constituted only of a base film and coverlays which cover both surfaces of the base film, and the base film and coverlays are each formed of a thin film of polyimide. Therefore, when the thickness of the film is made thin in accordance with further reduction in thickness and size of the printed wiring board, a sufficient strength cannot be provided around the notches, and it will be difficult to ensure a sufficient holding force given by the connector to the printed wiring board.

Accordingly, problems to be solved by the present invention include providing a printed wiring board which exhibits excellent disconnection resistance.

Means for Solving Problems

The printed wiring board according to a first aspect of the present invention, which is for solving the above problems, is a printed wiring board comprising: a base substrate; a plurality of pads for electrical connection that are disposed at one surface side of the base substrate and at a connection end portion to be connected with another electronic component; wirings that are connected with the pads; and an engageable part that is formed at the connection end portion and is to be engaged with an engagement part of the other electronic component in a direction of disconnection. The printed wiring board of the present invention is characterized by further comprising: a reinforcement layer that is disposed at the one surface side of the base substrate and at a frontward side with respect to the engageable part when viewed in a direction of connection with the other electronic component, and that is formed integrally with at least any one of the pads and wirings; and an insulating layer that covers a surface of the reinforcement layer.

The printed wiring board according to a second aspect of the present invention, which is for solving the above problems, is a printed wiring board comprising: a base substrate; a plurality of pads for electrical connection that are disposed at one surface side of the base substrate and at a connection end portion to be connected with another electronic component; wirings that are connected with the pads; and an engageable part that is formed at the connection end portion and is to be engaged with an engagement part of the other electronic component in a direction of disconnection. The printed wiring board of the present invention is characterized by further comprising a reinforcement layer that is disposed at the one surface side of the base substrate and at a frontward side with respect to the engageable part when viewed in a direction of connection with the other electronic component, and that is formed separately from the pads and wirings.

In the present description herein, the term "frontward" or "front" refers to the direction toward the front-end side of the connection end portion of the printed wiring board, while the term "rearward" or "rear" refers to the opposite direction.

In the printed wiring board of the second aspect of the present invention, it is preferred to provide an insulating layer that covers a surface of the reinforcement layer.

In each of the printed wiring boards of the first and second aspects of the present invention, it is preferred that the reinforcement layer has the same thickness as that of the wirings.

In each of the printed wiring boards of the first and second aspects of the present invention, it is preferred that the engageable part and the reinforcement layer are provided at each of both side edge parts of the connection end portion.

In each of the printed wiring boards of the first and second aspects of the present invention, it is preferred that the engageable part is a notched part formed at a side edge part of the connection end portion.

In each of the printed wiring boards of the first and second aspects of the present invention, it is preferred that the printed wiring board is a flexible printed wiring board.

The present invention also relates to a connecter which connects any of the above-described printed wiring boards with another wiring board. The connector is characterized by comprising: a housing that has an insertion opening into which the connection end portion of the printed wiring board is inserted; a plurality of contacts that are provided to correspond to the plurality of pads of the printed wiring board inserted in the housing; and an engagement part that engages with the engageable part provided with the printed wiring board in the direction of disconnection of the printed wiring board.

In the connector of the present invention, it is preferred to provide an operative member for connection and disconnection of the contacts and the printed wiring board.

In the connector of the present invention, it is preferred that the operative member is a rotative member that is rotatably supported by the housing around a rotation axis in a width direction and is operative to: rotate in one direction thereby to connect the contacts with the pads of the printed wiring board; and rotate in the other direction thereby to disconnect the contacts from the pads of the printed wiring board.

In the connector of the present invention, it is preferred that the engagement part is a lock member that is configured such that, as the rotative member rotates in the one direction, the lock member engages with the engageable part, which is provided at least at one side edge part of the connection end portion of the printed wiring board, in the direction of disconnection of the printed wiring board, and as the rotative member rotates in the other direction, the engagement is released.

Effect of Invention

The engageable part formed at the printed wiring board may not be enough only with the strength of the base substrate because the engageable part is pulled by a metal engagement part of another electronic component (e.g., a tab-like lock member of a connector to be described later). Accordingly, the present inventors have proposed to provide a reinforcement layer at the frontward side with respect to the engageable part in order to enhance the strength, and further to form such a reinforcement layer integrally with a pad for electrical connection that is located at the outermost side in the width direction of the connection end portion, in order to respond to requests of space saving and the like. When designing a wiring board, however, there are many situations that the above described engagement part of an electronic component, which is not used for signal transmission, is practically connected to ground, and if the engagement part is erroneously connected with the reinforcement layer, the pad for signal at the outermost side in the width direction of the printed wiring board will short-circuit with ground, leading to a risk that the signal leaks. Such signal leaking may be avoided if the engagement part is not connected to ground. However, if the engagement part is not connected to ground, the degree of freedom of wiring in the wiring board will be reduced.

In view of the above, the first aspect of the present invention has a feature that the insulating layer is provided on the surface of the reinforcement layer which is formed integrally with at least any one of the pads and wirings. According to this feature, the disconnection resistance of the printed wiring board can be enhanced while the signal in the pad can be prevented from transmitting via the reinforcement layer to the engagement part of another electronic component, which may be connected to ground. The above described problem of short-circuiting to ground can thus be solved. The second aspect of the present invention has a feature that the reinforcement layer is formed separately from the pads and wirings. According to this feature, the disconnection resistance of the printed wiring board can be enhanced while the signal in the pad can be prevented from transmitting via the reinforcement layer to the engagement part of another electronic component, which may be connected to ground. The above described problem of short-circuiting to ground can thus be solved.

Therefore, according to the present invention, a printed wiring board having excellent disconnection resistance can be provided, and the problem of short-circuiting to ground due to the reinforcement layer can also be solved.

BRIEF DESCRIPTION OF DRAWING(S)

Figure 1:
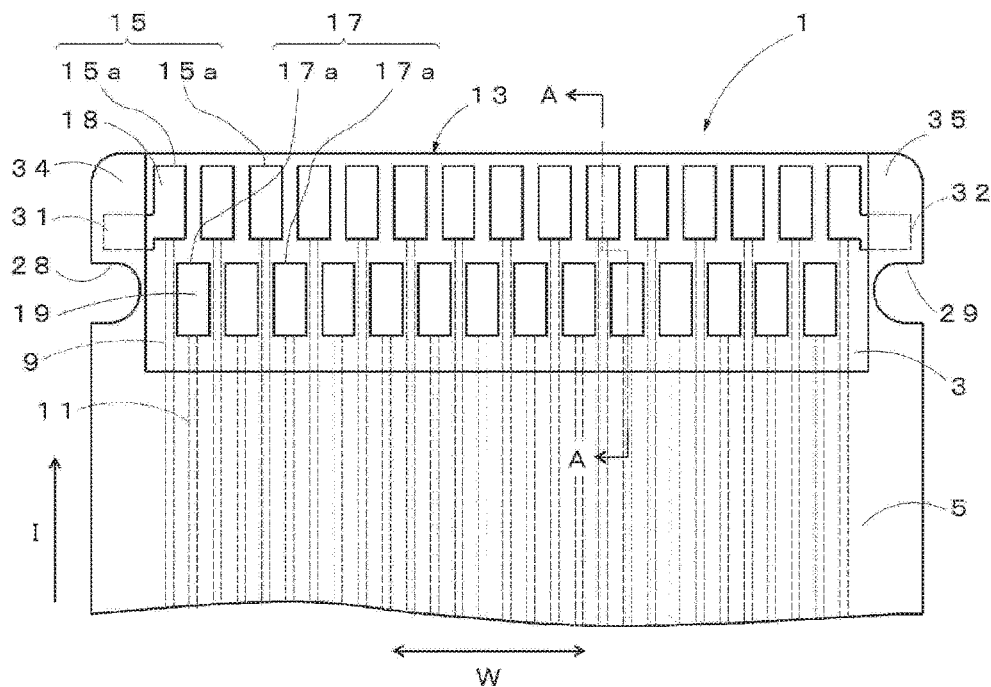
FIG. 1 is a plan view showing a part of a flexible printed wiring board according to an embodiment of the present invention.
Figure 4:
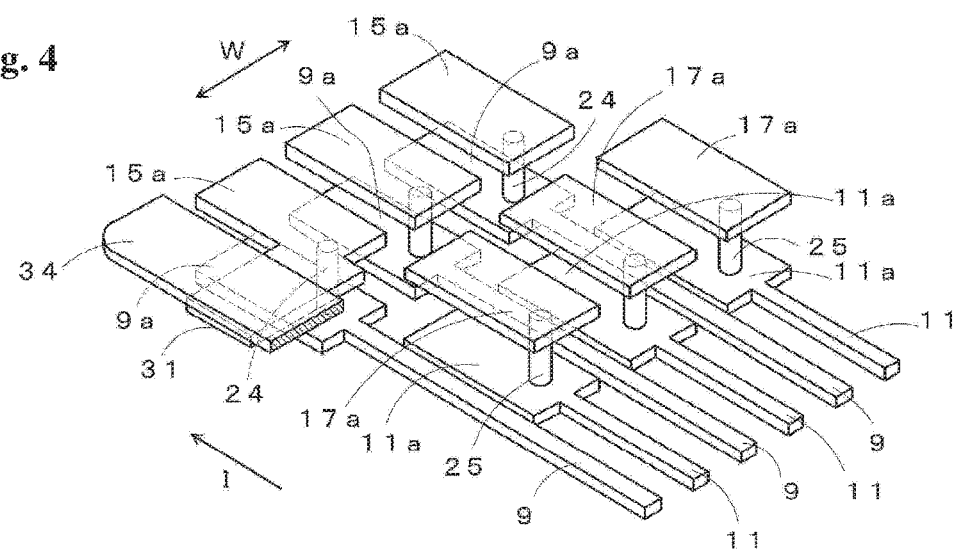

FIG. 4 is a perspective view schematically showing pads of a front array and pads of a rear array that are provided on a connection end portion of the flexible printed wiring board of FIG. 1, wirings that are located at the back surface side and connected with the pads, a reinforcement layer that is provided integrally with one of the pads, and an insulating layer that covers the reinforcement layer.

Figure 5A:
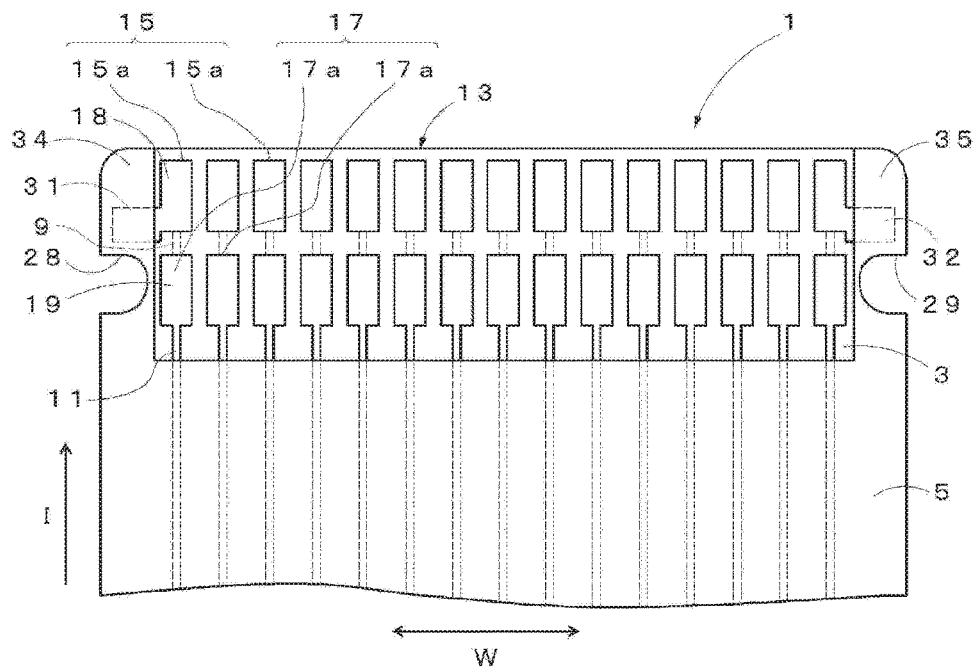
Figure 5B:
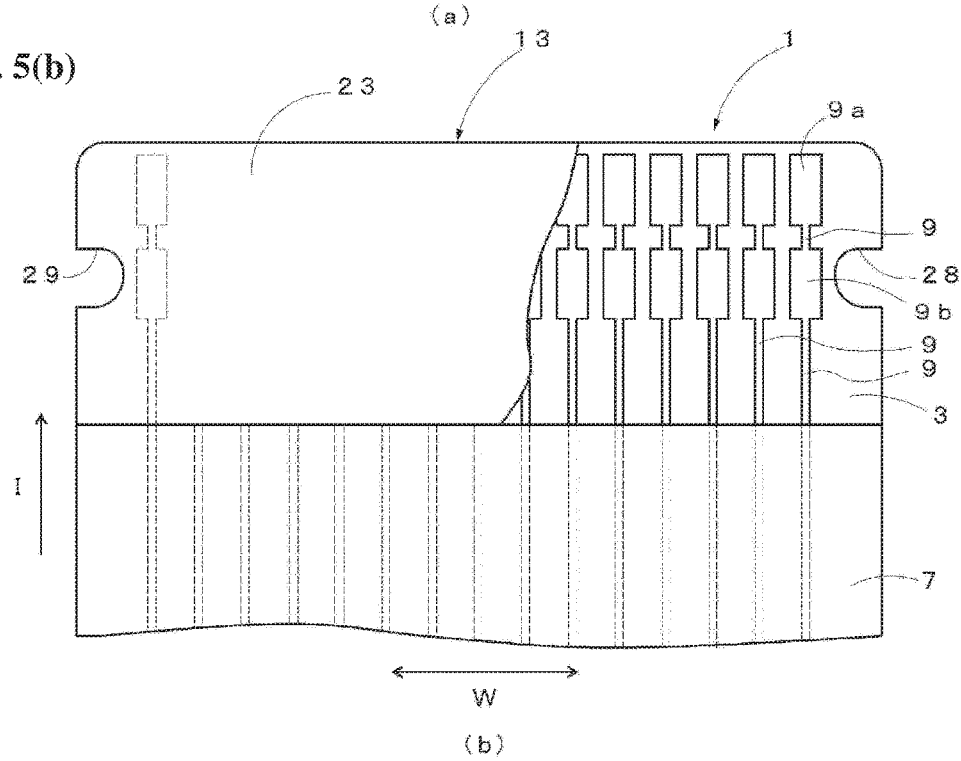

FIG. 5 shows a modified embodiment of the flexible printed wiring board of FIG. 1, wherein FIG. 5(a) is a plan view and FIG. 5(b) is a bottom view.

Figure 6:
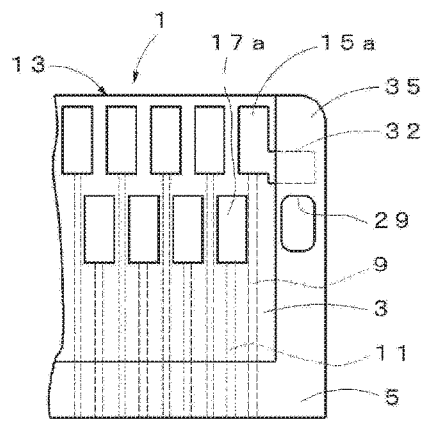

FIG. 6 is a partial plan view showing a modified embodiment of an engageable part provided at a connection end portion of a flexible printed wiring board according to the present invention.

Figure 7A:
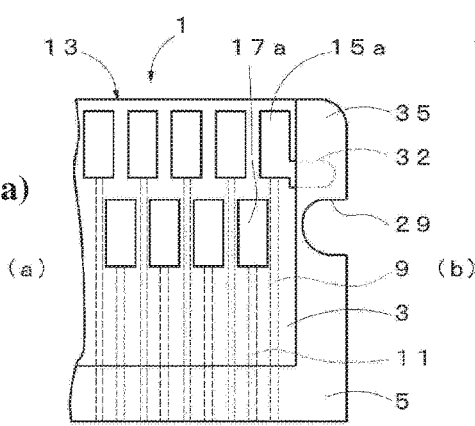
Figure 7B:
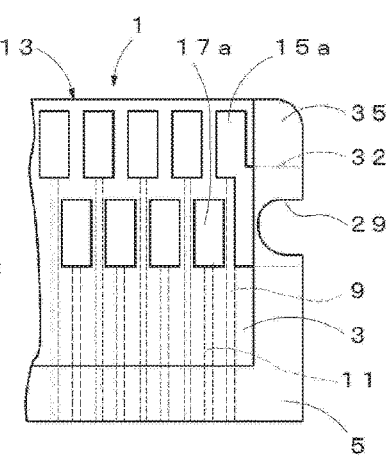
Figure 7C:
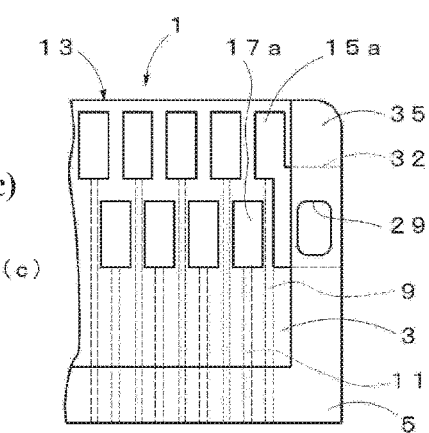

FIGS. 7(a) to 7(c) are partial plan views showing modified embodiments of a reinforcement layer of a flexible printed wiring board according to the present invention.

FIG. 8 is a set of views showing a modified embodiment of the flexible printed wiring board of FIG. 1, wherein FIG. 8(a) is a plan view and FIG. 8(b) is a cross-sectional view along line B-B in FIG. 8(a).

Figure 9A:
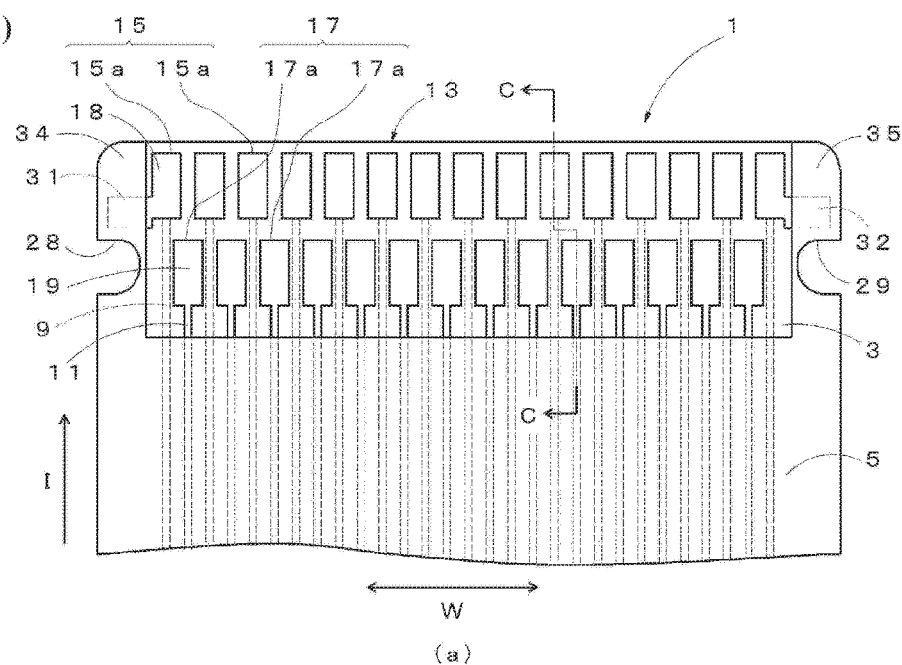
Figure 9B:
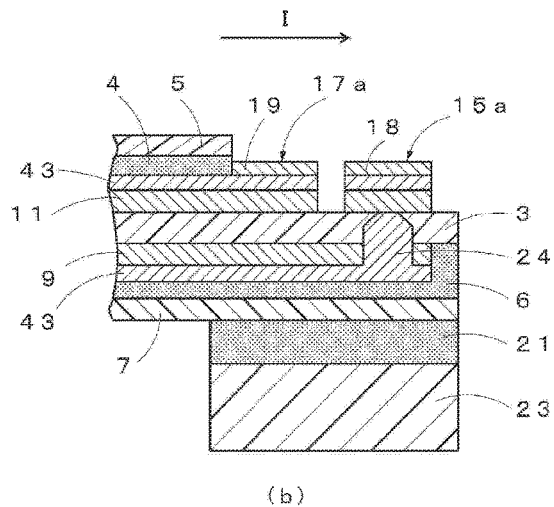

FIG. 9 is a set of views showing a modified embodiment of the flexible printed wiring board of FIG. 1, wherein FIG. 9(a) is a plan view and FIG. 9(b) is a cross-sectional view along line C-C in FIG. 8(a).

FIG. 10 is a set of cross-sectional views showing a part of production process for the flexible printed wiring board shown in FIG. 1.

Figure 3:
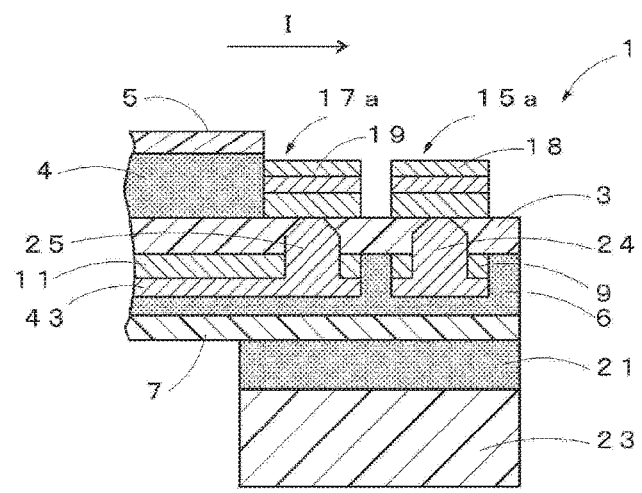
FIG. 3 is a cross-sectional view along line A-A in FIG. 1.
Figure 11A:
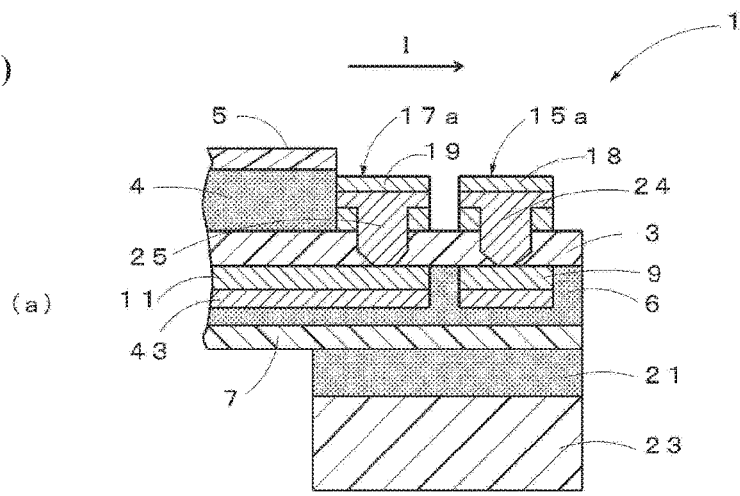
Figure 11B:
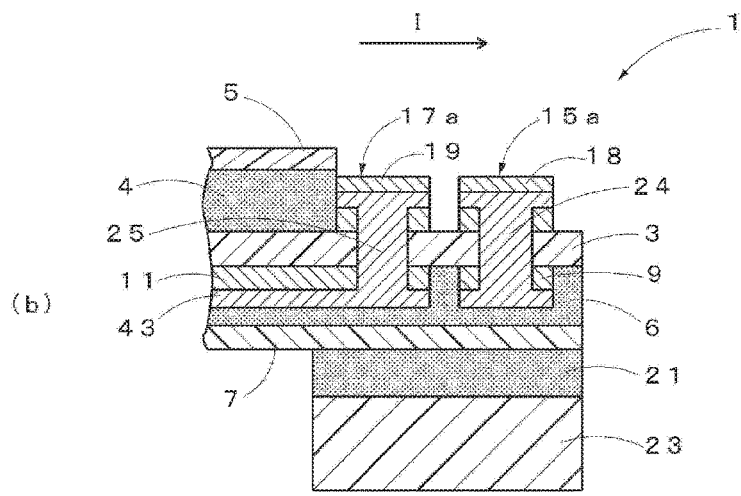

FIGS. 11(a) and 11(b) are cross-sectional views, at the same position as that in FIG. 3, showing modified embodiments of the flexible printed wiring board of FIG. 1.

Figure 12A:
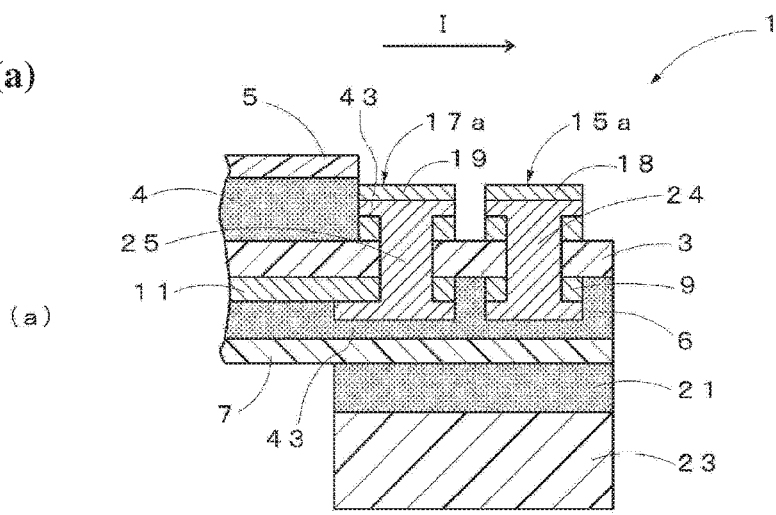
Figure 12B:
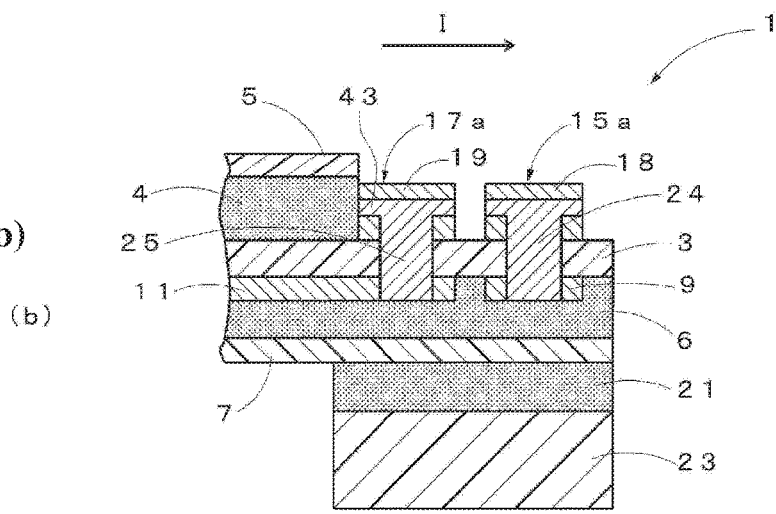

FIGS. 12(a) and 12(b) are cross-sectional views, at the same position as that in FIG. 3, showing modified embodiments of the flexible printed wiring board of FIG. 1.

Figure 13A:
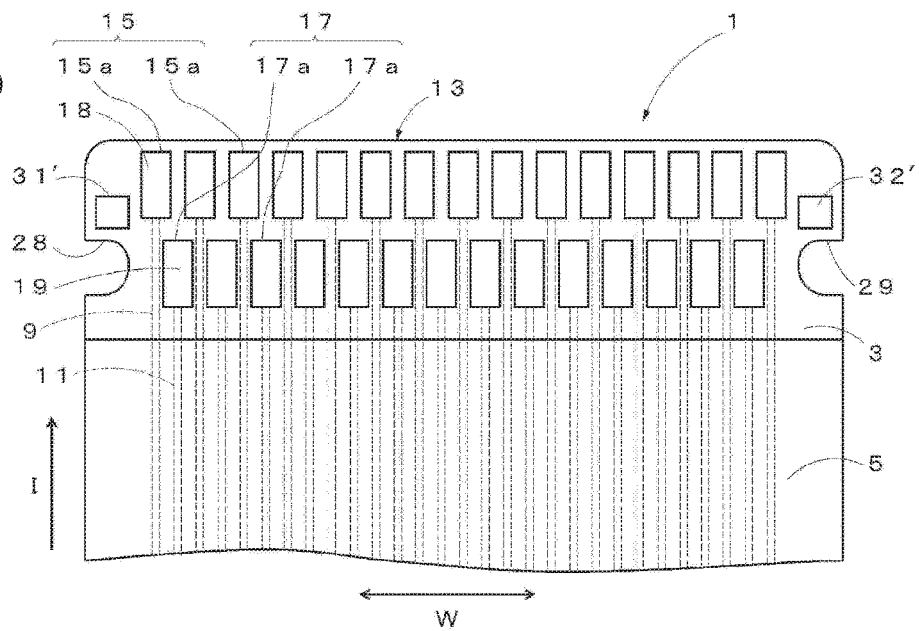
Figure 13B:
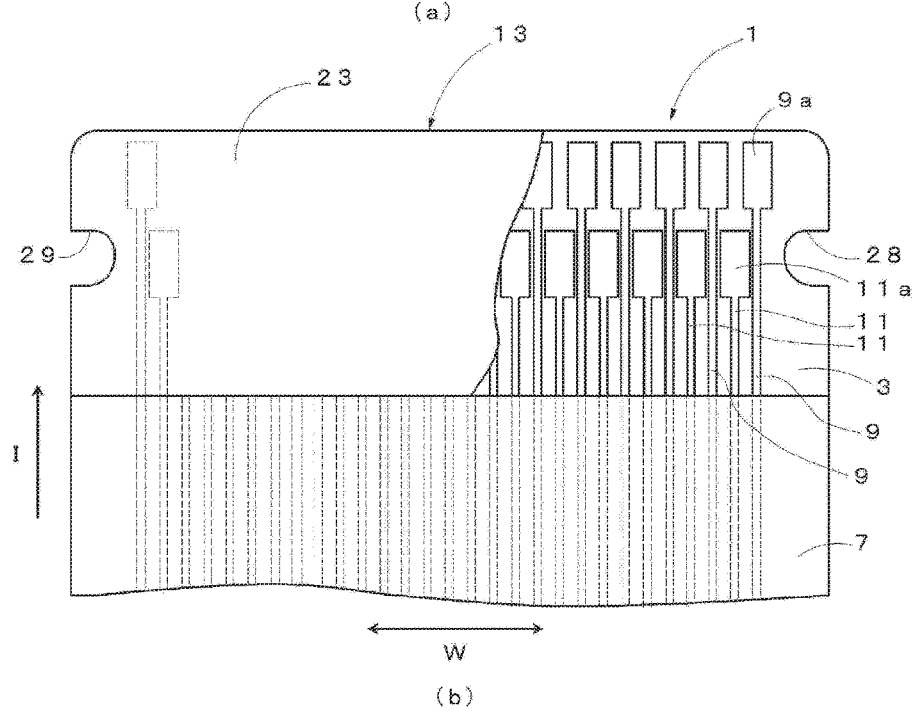

FIG. 13 is a set of views showing a flexible printed wiring board according to another embodiment of the present invention, wherein FIG. 13(a) is a plan view and FIG. 13(b) is a bottom view.

Figure 14A:
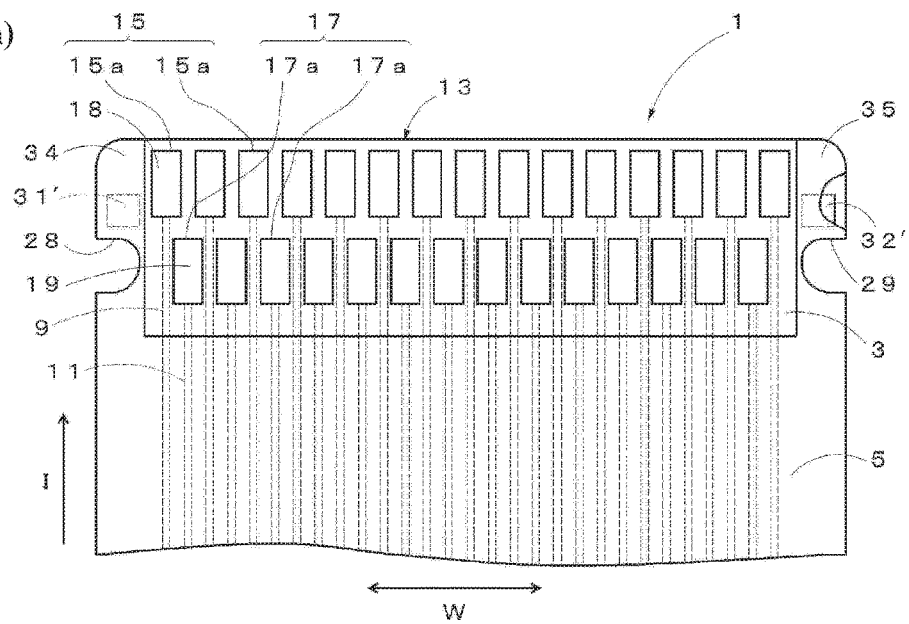
Figure 14B:
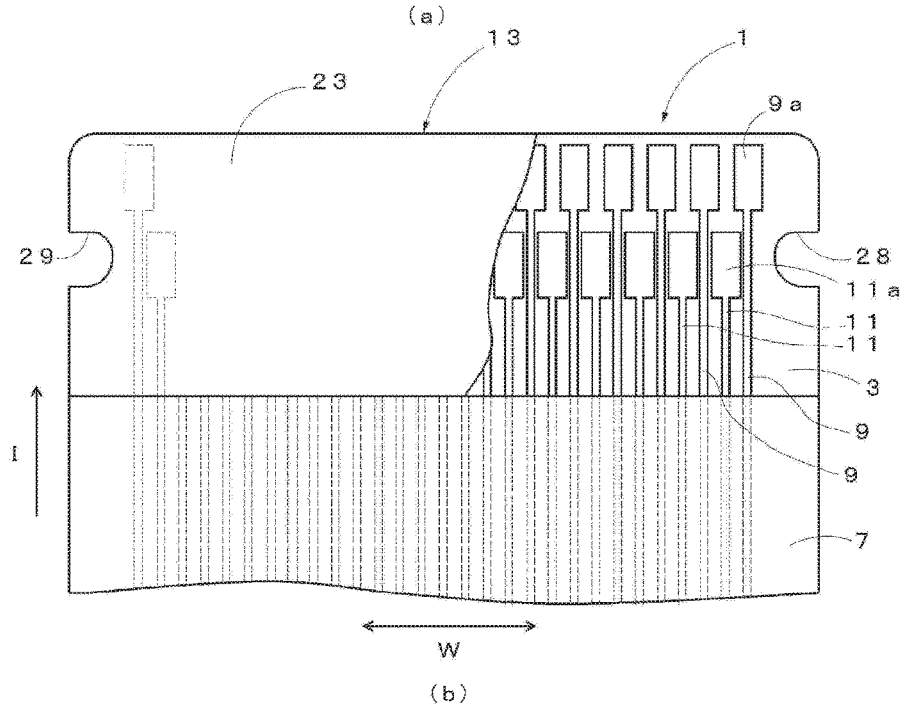

FIG. 14 is a set of views showing a flexible printed wiring board according to another embodiment of the present invention, wherein FIG. 14(a) is a plan view and FIG. 14(b) is a bottom view.

FIG. 15 is a set of views showing a flexible printed wiring board according to another embodiment of the present invention, wherein FIG. 15(a) is a plan view and FIG. 15(b) is a bottom view.

Figure 16:
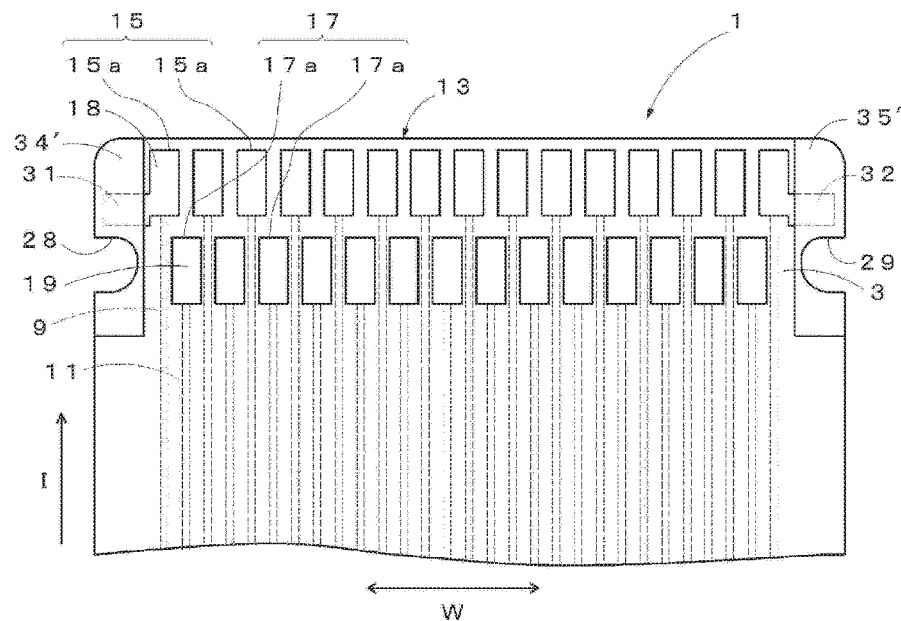

FIG. 16 is a plan view showing a flexible printed wiring board according to another embodiment of the present invention.

Figure 17:
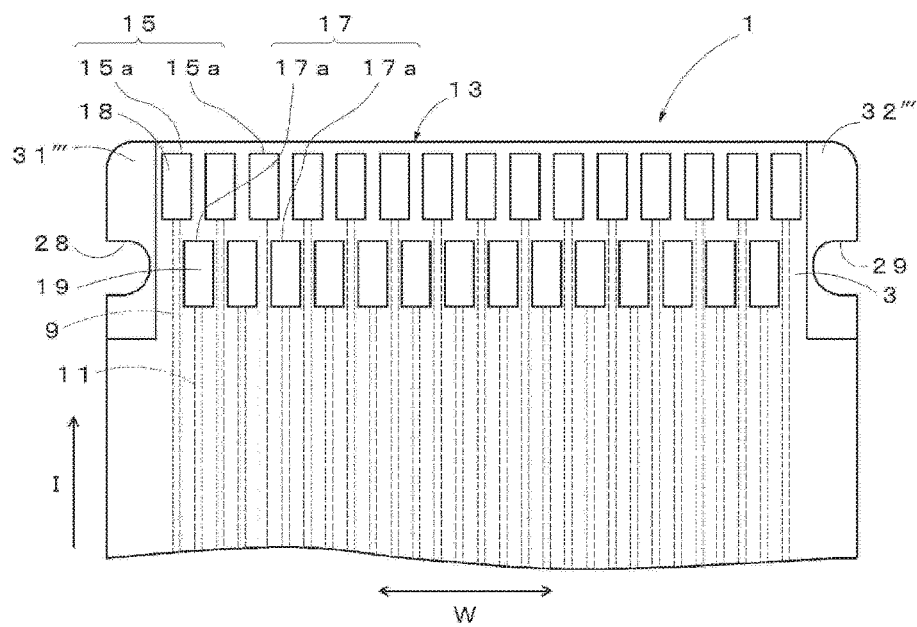

FIG. 17 is a plan view showing a flexible printed wiring board according to another embodiment of the present invention.

Figure 18:
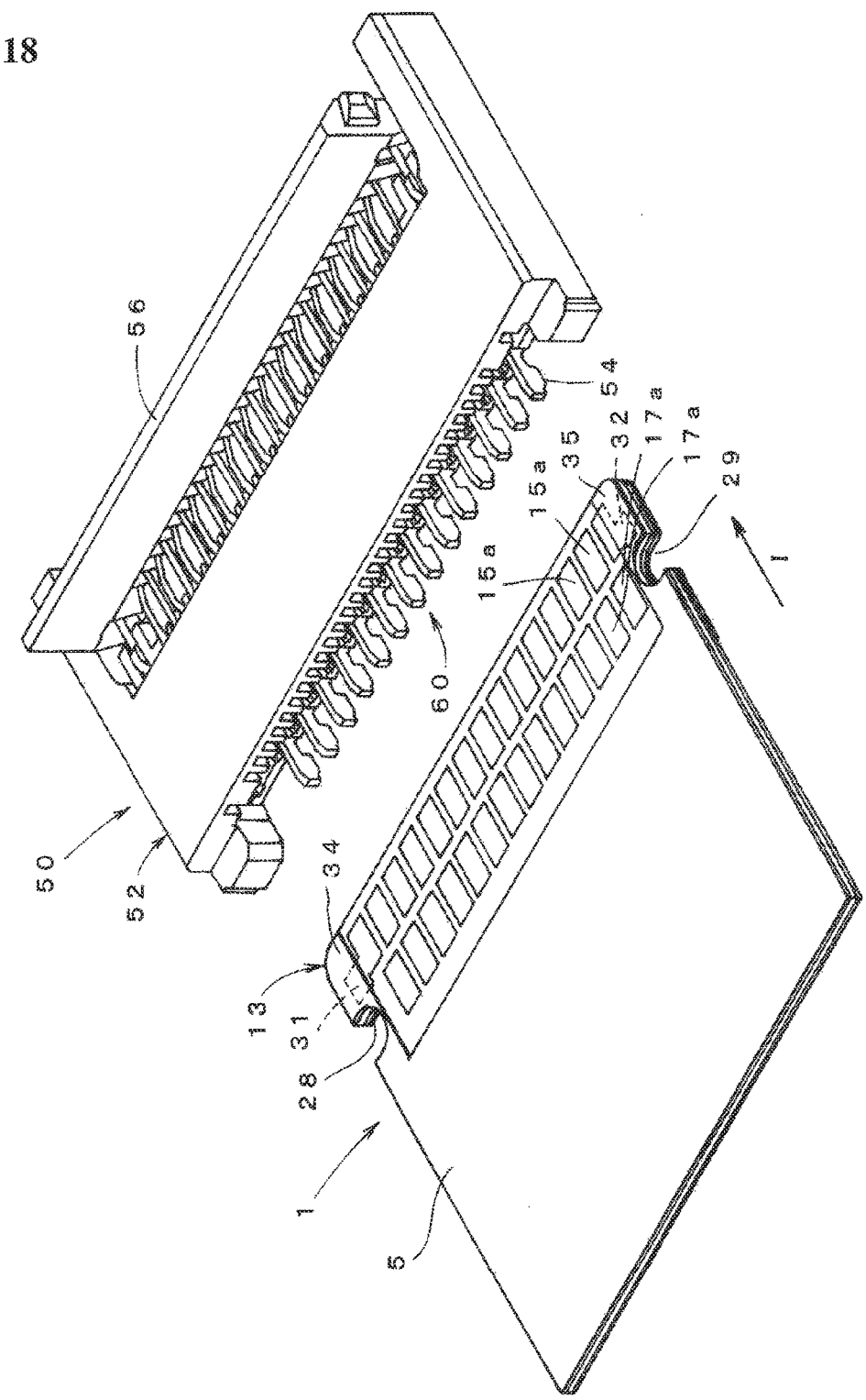

FIG. 18 is a perspective view showing a flexible printed wiring board according to the present invention and a connector, which is applicable to the flexible printed wiring board, according to an embodiment of the present invention.

Figure 19A:
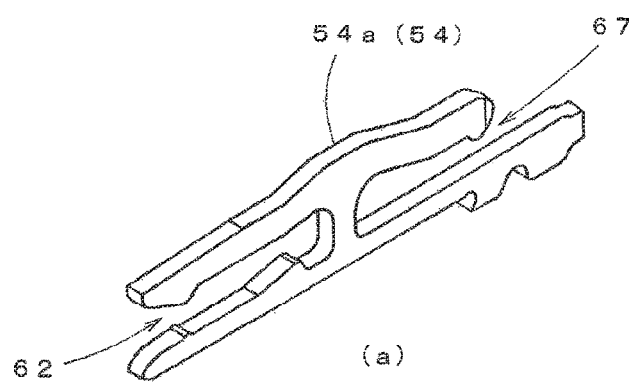
Figure 19B:
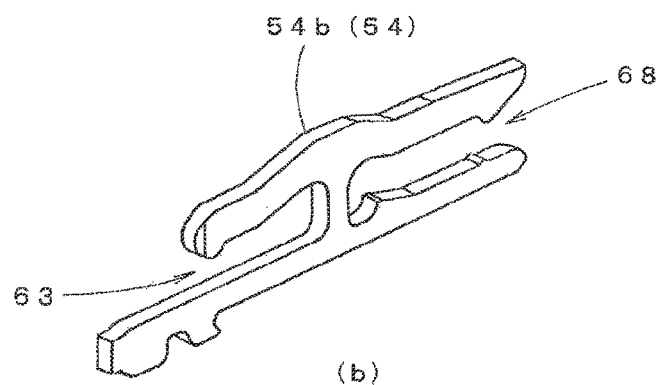

FIGS. 19(a) and 19(b) are perspective views showing two types of contacts provided in the connector of FIG. 18.

Figure 20:
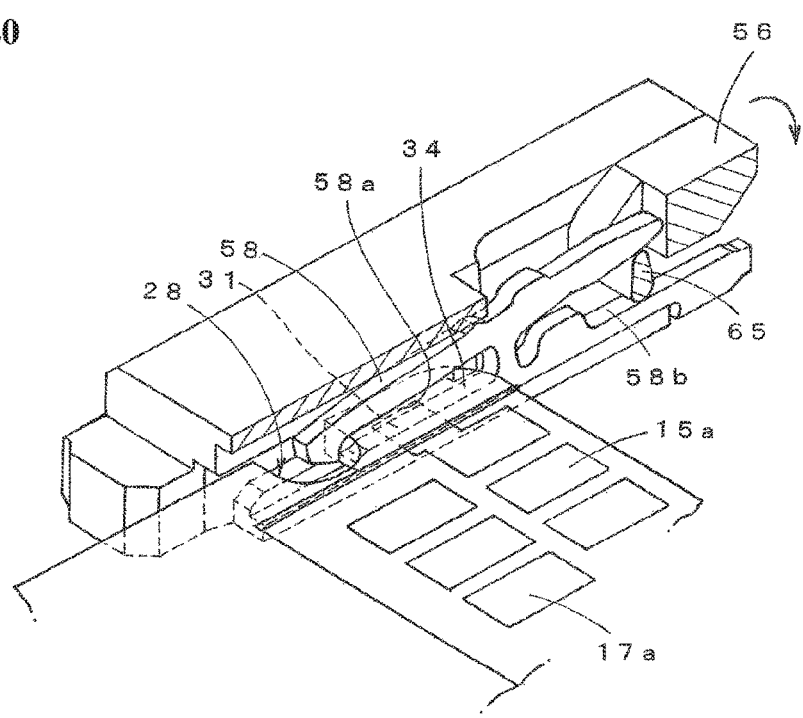

FIG. 20 is a cross-sectional perspective view showing a state in which the flexible printed wiring board of FIG. 1 inserted in the connector shown in FIG. 18 is engaged with a lock member of the connector.

Figure 21:
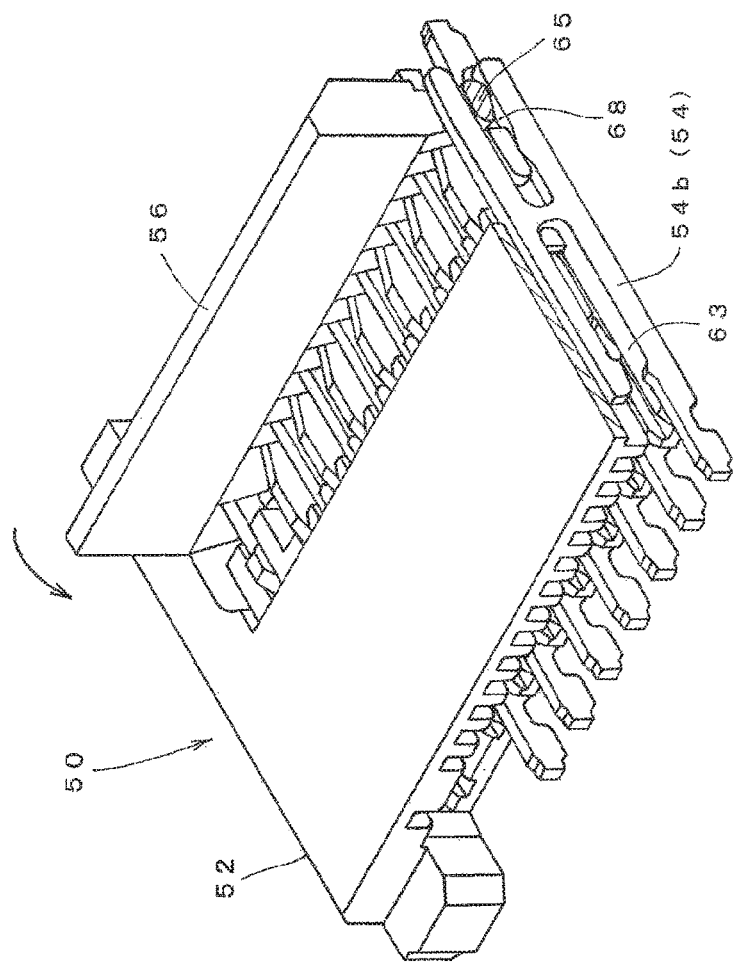

FIG. 21 is a cross-sectional perspective view showing a state in which a rotative member of the connector shown in FIG. 18 stands up.

Figure 22:
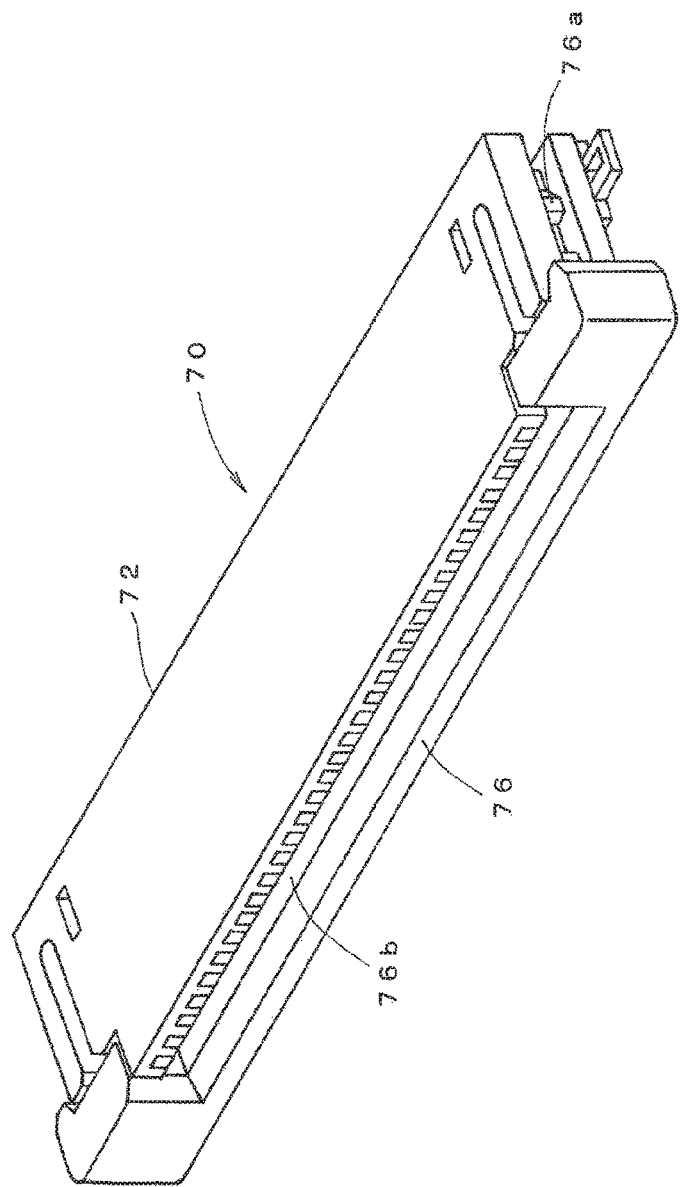

FIG. 22 is a perspective view showing a connector of another embodiment of the present invention, which is applicable to the flexible printed wiring board according to the present invention.

Figure 23A:
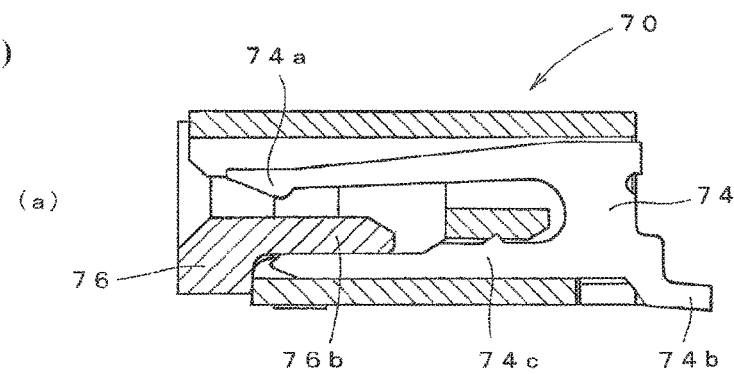
Figure 23B:
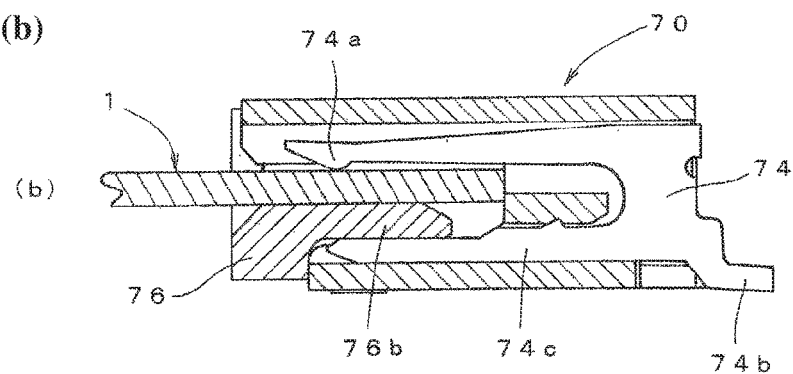

FIG. 23 is a set of cross-sectional views of the connector shown in FIG. 22, wherein FIG. 23(a) is a cross-sectional view showing a state before the flexible printed wiring board is inserted in a housing of the connector, and FIG. 23(b) is a cross-sectional view showing a state in which the flexible printed wiring board is inserted in the housing and pressed by a slider.

FIG. 24 is a plan view showing a part of a flexible printed wiring board of Comparative Example 1.

MODE(S) FOR CARRYING OUT THE INVENTION

Hereinafter, embodiments of the present invention will be described with reference to the drawings. While the description herein exemplifies a flexible printed wiring board (FPC) as a printed wiring board, the present invention is applicable to any other printed wiring board, such as a rigid flexible printed wiring board. In the description below, a specific example is described in which a flexible printed wiring board is inserted in a ZIF (Zero Insertion Force) connecter and used, but the printed wiring board of the present invention can also be used for a non-ZIF connector which utilizes the thickness of a printed wiring board to obtain a fitting force, and a backboard connector.
(Flexible Printed Wiring Board)

As shown in FIGS. 1 to 4, flexible printed wiring board 1 of the present embodiment comprises: a base film 3 as a base substrate; a first coverlay (referred to as an "upper surface side coverlay" for descriptive purposes, hereinafter) 5 that is attached via an adhesive layer 4 to one surface (upper surface herein) of the base film 3 so as to cover the one surface; and a second coverlay (referred to as a "lower surface side coverlay" for descriptive purposes, hereinafter) 7 that is attached via an adhesive layer 6 to the other surface (lower surface herein) of the base film 3 so as to cover the other surface. The base film 3 is formed of an insulating resin having flexibility, and examples thereof include polyimide, polyester, and polyethylene naphthalate. Each of the upper surface side coverlay 5 and the lower surface side coverlay 7 can be formed by attaching a film of insulating resin, such as polyimide, to the base film 3, or may otherwise be formed by applying a thermoset ink, ultraviolet curable ink, or photosensitive ink to the base film 3 and curing the ink.

The flexible printed wiring board 1 has a connection end portion 13, which is to be inserted in an insertion opening of a connector as will be described later, at least at one end portion in an insertion direction I. The upper surface side of the connection end portion 13 is not covered by the coverlay 5, and the exposed part of the connection end portion 13 is formed thereon with a plurality of pads 15a and 17a for electrical connection that are disposed in a staggered arrangement to form front and rear two arrays 15 and 17 when viewed in the insertion direction I. As will be understood, the pads 15a and 17a may not be disposed in a staggered arrangement. In an alternative embodiment, positions of the pads 15a of the front array 15 in the width direction (direction crossing the insertion direction I) W may be the same as those of the pads 17a of the rear array 17 (see FIG. 5). According to such disposition of pads, the width of the flexible printed wiring board 1 can be reduced, compared with a case of disposing the same number of pads in a staggered arrangement. Plated layers (e.g., gold plated layers) 18 and 19 are formed on the uppermost surfaces of the pads 15a of the front array 15 and the pads 17a of the rear array 17. It is sufficient if the plated layers 18 and 19 of the uppermost surfaces have at least electrical conductivity, but it is preferred that the plated layers 18 and 19 further have appropriate properties, such as corrosion resistance and wear resistance. Examples of the plated layers 18 and 19 include conductive carbon layers and solder layers in addition to the gold plated layers. The lowermost layer of the connection end portion 13 is provided with a reinforcement film 23 which is attached to the lower surface of the lower surface side coverlay 7 via an adhesive layer 21. The reinforcement film 23 can be formed of polyimide, for example.

The flexible printed wiring board 1 further has first wirings 9 connected with the pads 15a of the front array 15 and second wirings 11 connected with the pads 17a of the rear array 17. In the embodiment shown in FIG. 1, both the first wirings 9 and the second wirings 11 are disposed at the opposite side of the base film 3 to the side provided with the pads 15a and 17a, i.e., disposed between the base film 3 and the lower surface side coverlay 7. When both the first wirings 9 and the second wirings 11 are disposed at the back surface side of the base film 3 as in the present embodiment, the upper surface side coverlay 5 may not be provided (see FIG. 16 and FIG. 17). The first wirings 9 and the second wirings 11 are adjacent to one another in the width direction (direction crossing the insertion direction I) W and extend in the insertion direction (direction of connection) I to the connector. The first wirings 9 and the second wirings 11 can be formed of known conductive metal, e.g., copper or copper alloy. In addition, plated layers (e.g., copper plated layers) 43 may be formed on outer surfaces of the first wirings 9 and second wirings 11.

As shown in FIGS. 3 and 4, each pad 15a of the front array 15 and each first wiring 9 disposed at the lower surface side (other surface side) of the base film 3 are connected with each other via a via 24 that penetrates the base film 3. Likewise, each pad 17a of the rear array 17 and each second wiring 11 disposed at the lower surface side (other surface side) of the base film 3 are connected with each other via a via 25 that penetrates the base film 3. In the embodiment shown, one via 24 and one via 25 are provided for each pad 15a and each pad 17a, respectively, but two or more vias 24 and two or more vias 25 may be provided for each pad 15a and each pad 17a, respectively, in view of improving the stability of the pads 15a and 17a, reducing the electrical resistance, etc.

As shown in FIG. 4, in the present embodiment, each first wiring 9 and each second wiring 11 have expanded-width parts 9a and 11a, respectively, at positions corresponding to each pad 15*a* and each pad 17*a* of the upper side. The expanded-width parts 9*a* and 11*a* have functions as reinforcement materials to maintain the thickness of the flexible printed wiring board 1 constant at locations of the pads 15*a* and 17*a*, i.e., to improve creep resistance, and are not in direct contact with the contacts of another electronic component. If expanded-width parts or reinforcement materials are not present at positions at the back surface side of the base film 3 corresponding to the pads 15*a* and 17*a* at the top surface side, creep deformation of the adhesive layer included in the flexible printed wiring board 1 will occur particularly under a high temperature environment to make the thickness of the flexible printed wiring board 1 ununiform, possibly resulting in poor electrical contact properties. In the present embodiment, the expanded-width parts 9*a* and 11*a* have a shape that corresponds to the shape of the pads 15*a* and 17*a* located above, i.e., a shape that is substantially the same as the shape of the pads 15*a* and 17*a*. In an alternative embodiment, however, the expanded-width parts 9*a* and 11*a* may be formed smaller or larger than the pads 15*a* and 17*a* located above, provided that the stability of contact between the pads 15*a* and 17*a* and the contacts of another electronic component does not deteriorate. In the present invention, the expanded-width parts 9*a* and 11*a* may not be provided.

Figure 2:
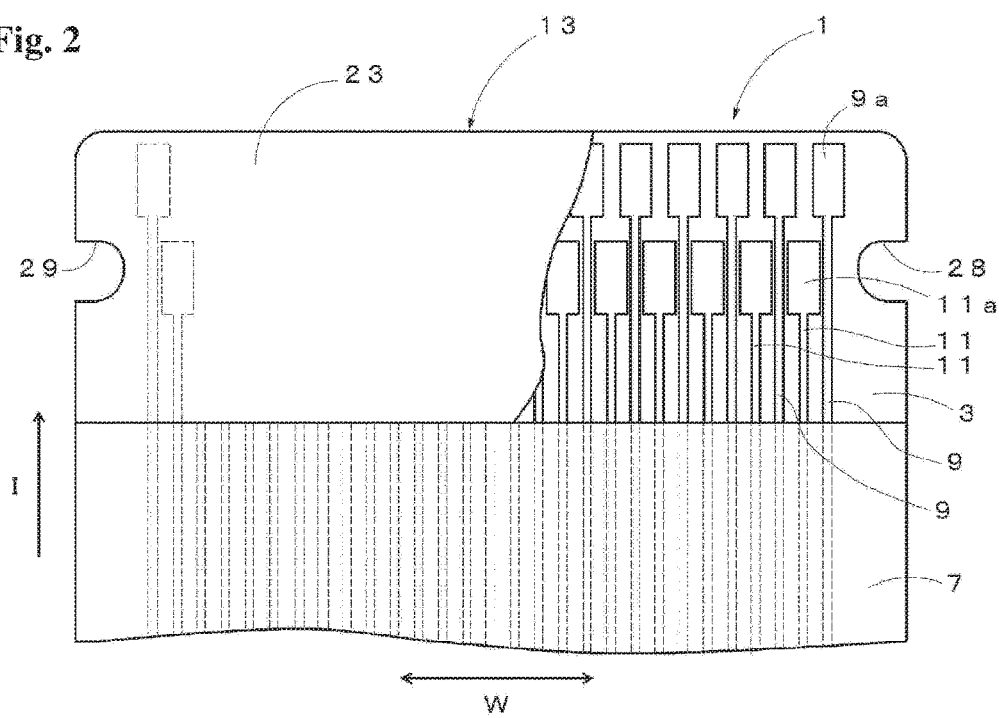
FIG. 2 is a bottom view of the flexible printed wiring board shown in FIG. 1.

As shown in FIG. 1 and FIG. 2, the flexible printed wiring board 1 of the present embodiment has, at least at one of side edge parts (end edges in the width direction) of the connection end portion 13, specifically at both side edge parts herein, engageable parts 28 and 29 that are to be engaged with engagement parts of another electronic component as an object of connection (e.g., tab-like lock members provided with a connector to be described later) in the direction of disconnection (which is the opposite direction to the direction of connection). In the embodiment shown in FIG. 1 and FIG. 2, the engageable parts 28 and 29 are provided as notched parts formed at the side edge parts of the connection end portion 13, but the present invention is not limited thereto. In an alternative embodiment, the engageable parts 28 and 29 may be provided as through-holes 29 as shown in FIG. 6 or blind holes (not shown).

As shown in FIG. 1 and FIG. 4, the flexible printed wiring board 1 of the present embodiment has reinforcement layers 31 and 32 that are formed integrally with pads, specifically with the outermost pads 15*a* in the width direction of the pads 15*a* of the front array 15 herein, at least at the frontward side with respect to the engageable parts 28 and 29 when viewed in the direction of connection (insertion direction I) with another electronic component and at the upper surface side (the side on which the pads 15*a* and 17*a* are provided) of the base film 3.

The reinforcement layers 31 and 32 may have the same thickness as that of the wirings 9 and 11, but can also be formed thicker or thinner than the wirings 9 and 11, provided that a necessary strength is obtained. In view of ensuring a sufficient disconnection strength, the width (length along the width direction W) of the reinforcement layers 31 and 32 may preferably be 100% or more of the width of the engageable parts 28 and 29. The length (length along the insertion direction I) of the reinforcement layers 31 and 32 can be appropriately set in accordance with various conditions (such as strength and material). The shape of the reinforcement layers 31 and 32 is rectangular in the embodiment shown, but the present invention is not limited thereto. In alternative embodiments, various shapes can be employed, such as a shape having an arc at least as a part thereof as shown in FIG. 7(*a*) and shapes surrounding the engageable parts 28 and 29 as shown in FIGS. 7(*b*) and 7(*c*). The reinforcement layers 31 and 32 may be disposed so as not to be exposed at the end edges of the engageable parts 28 and 29, such as shown in FIGS. 6 and 7(*a*). In such cases, when the flexible printed wiring board 1 is punched out into a final shape using a metal die at the time of production, the metal die does not directly shear the copper foil, so that the life of the metal die will be extended and the production failure such as burrs can be prevented.

The flexible printed wiring board 1 of the present embodiment has insulating layers 34 and 35 on the surfaces of the reinforcement layers 31 and 32. In more detail, the insulating layers 34 and 35 are configured such that the outer side parts of the upper surface side coverlay 5 in the width direction are extended frontward so as not to overlap the pads 15*a* and 17*a* and the extended parts cover the upper surfaces of the reinforcement layers 31 and 32. In the present embodiment, the insulating layers 34 and 35 are each formed as an additional part of the upper surface side coverlay 5, and in such a case the insulating layers 34 and 35 can be easily formed, but the present invention is not limited thereto. In an alternative embodiment, insulating layers (not shown) different from the upper surface side coverlay 5 may be attached to the upper surfaces of the reinforcement layers 31 and 32 in a separate procedure.

The flexible printed wiring board 1 of the present embodiment with the above structure has a feature that the engageable parts 28 and 29 are provided at the side edge parts of the connection end portion 13 so as to be engaged with the engagement parts of another electronic component in the direction of disconnection as well as a feature that the reinforcement layers 31 and 32 formed integrally with the pads 15*a* are provided at the upper surface side of the base film 3 and at the frontward side with respect to the engageable parts 28 and 29. According to the features of the present embodiment, the strength of the frontward side of the flexible printed wiring board 1 with respect to the engageable parts 28 and 29 can be enhanced, and a sufficient engagement force (disconnection resistance) with the engagement parts of the other electronic component can be ensured even when the flexible printed wiring board 1 is made thin and small. Furthermore, even when the engagement parts of the other electronic component are connected to ground, the pads 15*a* and 17*a* for signals can be prevented from short-circuiting with the ground via the reinforcement layers 31 and 32 and the engagement parts of the other electronic component because the reinforcement layers 31 and 32 are covered by the insulating layers 34 and 35 and the engagement parts of the other electronic component are not to be in direct contact with the reinforcement layers 31 and 32.

The flexible printed wiring board 1 of the present embodiment has a feature that both of the first wirings 9 connected to the pads 15*a* of the front array 15 and the second wirings 11 connected to the pads 17*a* of the rear array 17 are disposed on the back surface (other surface) of the base film 3. According to the feature of the present embodiment, wirings at the top surface side of the flexible printed wiring board 1 can be omitted, and an advantage is thus obtained that a wide space for mounting can be ensured when other electronic components such as chips are mounted on the top surface side.

The flexible printed wiring board 1 of the present embodiment has a feature that the expanded-width parts 9*a* and 11*a* are provided at positions of the first wirings 9 and second wirings 11 corresponding respectively to the pads 15*a* and 17*a*. According to the feature of the present embodiment, even if the contacts of another electronic component to be in contact with the pads 15a and 17a are misaligned to some extent from the normal positions in the pads such as due to production error, the stable connection of the pads 15a and 17a with the contacts of the other electronic component can be maintained for a long period of time, because the thickness of a part of the flexible printed wiring board 1 to be in contact with the contacts can be uniform, i.e., the creep resistance can be improved. In particular, the expanded-width parts 9a and 11a may have the shapes corresponding to shapes of the pads 15a and 17a, as in the present embodiment, thereby to more steadily obtain that effect.

The flexible printed wiring board 1 of the present embodiment has a feature that the reinforcement layers 31 and 32 have the same thickness as that of the wirings 9 and 11. According to the feature of the present embodiment, the flexible printed wiring board 1 can have a sufficient thickness at locations to be in contact with the engagement parts of another electronic component, and the disconnection resistance of the flexible printed wiring board 1 can be steadily enhanced.

The flexible printed wiring board 1 of the present embodiment has a feature that the engageable parts 28, 29 and the reinforcement layers 31, 32 are provided at both side edge parts of the connection end portion 13. According to the feature of the present embodiment, the disconnection resistance of the flexible printed wiring board 1 can be further enhanced, and more stable holding can be achieved.

The above description is directed to an embodiment in which, as shown in FIGS. 1 to 4, both the first wirings 9 and the second wirings 11 are disposed at the back surface side of the base film 3, but the present invention is not limited thereto. In an alternative embodiment, as shown in FIGS. 8(a) and 8(b), both the first wirings 9 and the second wirings 11 may be disposed at the top surface side of the base film 3, i.e., at the side on which the pads 15a and 17a are located. Also in this case, reinforcement materials 9a' and 11a' may be provided as substitute for the above-described expanded-width parts 9a and 11a at the back surface side (other surface side) of the base film 3 and at positions corresponding to the pads 15a and 17a located above. In the embodiment of FIG. 8, the reinforcement materials 9a' and 11a' are formed of the same material as that of the wirings 9 and 11, but can also be formed of other material, such as resin, which has creep resistance, because the reinforcement materials 9a' and 11a' are not parts of the wirings 9 and 11.

In an alternative embodiment, as shown in FIG. 5 and FIGS. 9(a) and 9(b), the disposition of the first wirings 9 and second wirings 11 may be modified such that the second wirings 11 are disposed at the top surface side (one surface side) of the base film 3 while the first wirings 9 are disposed at the back surface side (the other surface side) of the base film 3. In the case of FIG. 5 herein, the first wirings 9 provided at the back surface side of the base film 3 are used to form expanded-width parts 9a corresponding to pads 15a of a front array 15 and expanded-width parts 9b corresponding to pads 17a of a rear array 17. Also in the case of FIG. 9, although not shown in detail, expanded-width parts 9a as shown in FIG. 4 may be provided on the locations at the back surface side corresponding to pads 15a of a front array 15, and reinforcement materials 11a' as shown in FIG. 8(b) may be provided on the locations at the back surface side corresponding to pads 17a of a rear array 17. In an alternative embodiment, the first wirings provided at the back surface side of the base film 3 as shown in FIG. 5 may be used to form expanded-width parts corresponding to pads 15a of a front array 15 and expanded-width parts corresponding to pads 17a of a rear array 17.

(Method for Producing Flexible Printed Wiring Board)

An embodiment of a method for producing the flexible printed wiring board 1 shown in FIGS. 1 to 4 will now be described with reference to FIG. 10 to FIG. 12 and FIG. 3.

Figure 10A:
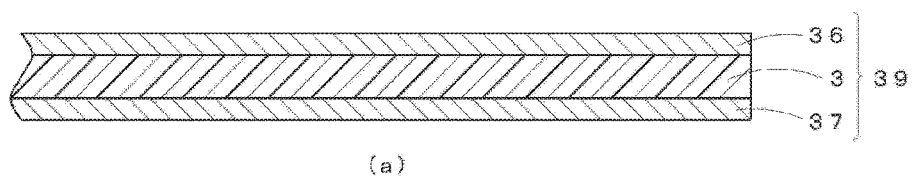
Figure 10B:
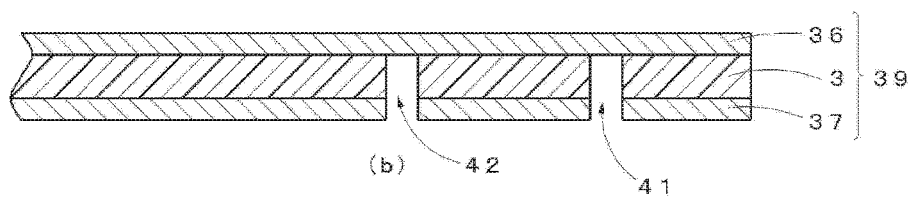

First, as shown in FIG. 10(a), a double-sided copper clad laminate 39 is formed as a starting material in which both surfaces of a base film 3 of polyimide is laminated with copper foils 36 and 37. The double-sided copper clad laminate 39 may be obtained by depositing or sputtering copper on the base film 3 and thereafter performing copper plating, or may otherwise be obtained by attaching the copper foils 36 and 37 to the base film 3 via an adhesive or the like. Then, as shown in FIG. 10(b), blind via holes 41 and 42 are formed to pass through the copper foil 37 and the base film 3 in the double-sided copper clad laminate 39 at predetermined positions, such as by laser machining and CNC drilling, from below (from the lower surface side).

Figure 10C:
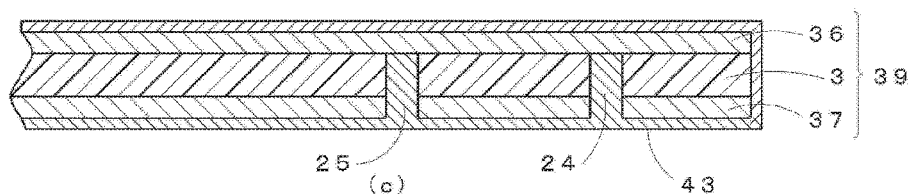
Figure 10D:
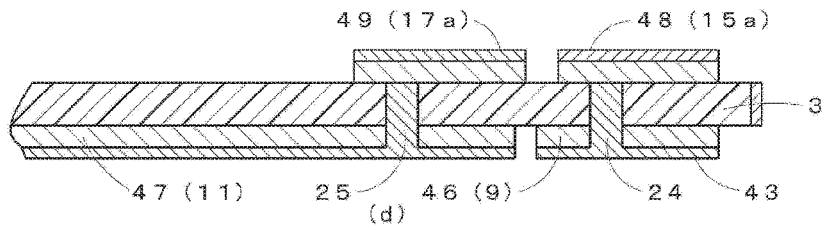

Next, as shown in FIG. 10(c), a process of DPP (Direct Plating Process) is performed to form conductive layers on the inner circumferential surfaces of the blind via holes 41 and 42, followed by formation of a copper plated layer 43 on the whole surface of the double-sided copper clad laminate 39 including the inner surfaces of the blind via holes 41 and 42. When forming the copper plated layer 43, a scheme of so-called button plating may be employed to partially plate a specific structure. Through the above operation, vias 24 and 25 are formed to electrically connect the upper surface side copper foil 36 of the double-sided copper clad laminate 39 with the lower surface side copper foil 37. The vias 24 and 25 may be hollow vias obtained by only plating the inner circumferential surfaces of the blind via holes 41 and 42, or may also be so-called filled vias obtained by filling the blind via holes 41 and 42 with plated materials or conductive materials. Subsequently, as shown in FIG. 10(d), the upper surface side copper foil 36 and the lower surface side copper foil 37 are patterned to form pads 48 and 49 on the top surface of the base film 3 and wiring patterns 46 and 47 at the lower surface side of the base film 3 and form reinforcement layers (not shown). The patterning of the upper surface side copper foil 36 and lower surface side copper foil 37 can be performed by forming mask patterns on the surfaces of the upper surface side copper foil 36 and lower surface side copper foil 37 using photolithography technique, for example, and thereafter etching the upper surface side copper foil 36 and lower surface side copper foil 37.

Then, an upper surface side coverlay 5 and a lower surface side coverlay 7 (see FIG. 3) are attached, via adhesives, to both surfaces of the double-sided copper clad laminate 39 formed with the wiring patterns.

Subsequently, gold plated layers 18 and 19 are formed on the surfaces of the pads 15a and 17a formed at the upper surface side, and both side edge parts of the connection end portion are partially removed such as using metal dies, thereby to form engageable parts 28 and 29 at the both side edge parts. The flexible printed wiring board 1 as shown in FIGS. 1 to 4 is thus completed. In an alternative embodiment, the blind via holes 41 and 42 may be formed from above (from the upper surface side) as shown in FIG. 11(a), or may also be formed as through holes as shown in FIG. 11(b). As described above, the copper plated layer 43 may not be formed on the whole surface of the double-sided copper clad laminate 39. For example, the copper plated layer 43 may be formed only within the region of the connection end portion 13 (double-sided partial plating) as shown in FIG. 12(a), or may also be formed only on the upper surface side copper foil 36 within the region of the connection end portion 13 (single-sided partial plating) as shown in FIG. 12(b).

(Flexible Printed Wiring Boards of Other Embodiments)

Flexible printed wiring boards of other embodiments according to the present invention will then be described with reference to FIG. 13 to FIG. 17. Similar elements to those in the flexible printed wiring board 1 of the previous embodiment are denoted by the same reference numerals, and the descriptions thereof are omitted.

In the flexible printed wiring board 1 of the previous embodiment, the reinforcement layers 31 and 32 are formed integrally with the pads 15a at the top surface side (one surface side) of the base film 3, but the flexible printed wiring board 1 shown in FIGS. 13(a) and 13(b) has a feature that reinforcement layers 31' and 32' are formed separately from the pads 15a. That is, the reinforcement layers 31' and 32' are separated from the pads 15a and 17a and are not electrically connected with the pads 15a and 17a.

According to this feature of the present embodiment, the reinforcement layers 31' and 32' can enhance the disconnection resistance of the flexible printed wiring board 1, and even when the engagement parts of another electronic component are connected to ground, the pads 15a and 17a for signals can be prevented from short-circuiting with the ground via the reinforcement layers 31' and 32' and the engagement parts of the other electronic component because the reinforcement layers 31' and 32' are not electrically connected with the pads 15a and 17a.

In the embodiment of FIGS. 13(a) and 13(b), both the first wirings 9 and the second wirings 11 are disposed at the back surface side of the base film 3, but as in FIG. 8, both the first wirings 9 and the second wirings 11 may be disposed at the top surface side of the base film 3, or as in FIGS. 5 and 9, the first wirings 9 may be disposed at the back surface side of the base film 3 while the second wirings 11 may be disposed at the top surface side of the base film 3 (not shown).

Referring next to FIGS. 14(a) and 14(b) which show a modified embodiment of the flexible printed wiring board shown in FIG. 13, the flexible printed wiring board 1 of FIGS. 14(a) and 14(b) is different from the flexible printed wiring board 1 of FIG. 13 in an aspect that the flexible printed wiring board 1 has insulating layers 34 and 35 on the surfaces of the reinforcement layers 31' and 32', respectively.

In more detail, the insulating layers 34 and 35 are configured such that the outer side parts of the upper surface side coverlay 5 in the width direction are extended frontward so as not to overlap the pads 15a and 17a and the extended parts cover the upper surfaces of the reinforcement layers 31' and 32'.

According to this feature of the present embodiment, the reinforcement layers 31' and 32' can enhance the disconnection resistance of the flexible printed wiring board 1, and even when the engagement parts of another electronic component are connected to ground, the pads 15a for signals can be more steadily prevented from short-circuiting with the ground via the reinforcement layers 31' and 32' and the engagement parts of the other electronic component because the reinforcement layers 31' and 32' are not electrically connected with the pads 15a and 17a and the engagement parts of the other electronic component are insulated from the reinforcement layers 31' and 32' by the insulating layers 34 and 35. Furthermore, such insulating layers 34 and 35 also serve as reinforcement layers that enhance the strength around the engageable parts 28 and 29, and can further enhance the disconnection resistance of the flexible printed wiring board 1.

In the embodiment of FIGS. 14(a) and 14(b), both the first wirings 9 and the second wirings 11 are disposed at the back surface side of the base film 3, but as in FIG. 8, both the first wirings 9 and the second wirings 11 may be disposed at the top surface side of the base film 3, or as in FIG. 5 and FIG. 9, the first wirings 9 may be disposed at the back surface side of the base film 3 while the second wirings 11 may be disposed at the top surface side of the base film 3 (not shown). In the embodiment of FIG. 14, the insulating layers 34 and 35 are each formed as an additional part of the upper surface side coverlay 5, but the present invention is not limited thereto. In an alternative embodiment, insulating layers different from the upper surface side coverlay 5 may be attached to the upper surfaces of the reinforcement layers 31' and 32' in a separate procedure.

Next, FIG. 15 shows a further modified embodiment of the flexible printed wiring board. The flexible printed wiring board 1 shown in FIG. 15 is configured such that the outer side parts of the upper surface side coverlay 5 in the width direction are extended frontward so as not to overlap the pads 15a and 17a and the extended parts constitute reinforcement layers 31" and 32" that are formed separately from the pads 15a and 17a. Such a configuration can also enhance the strength of the frontward side from the engageable parts 28 and 29.

Referring next to FIG. 16 which shows a flexible printed wiring board according to still another embodiment of the present invention, the flexible printed wiring board 1 of FIG. 16 is configured such that both of the first wirings 9 connected to the pads 15a of the front array 15 and the second wirings 11 connected to the pads 17a of the rear array 17 are disposed on the other surface (back surface) of the base film 3, and the flexible printed wiring board 1 has reinforcement layers 31 and 32 and insulating layers 34' and 35' that cover the surfaces of the reinforcement layers 31 and 32, but the flexible printed wiring board 1 of FIG. 16 is different from the flexible printed wiring board 1 of FIG. 1 in an aspect that the flexible printed wiring board 1 does not have an upper surface side coverlay. The insulating layers 34' and 35' can be formed of an insulating resin, e.g., polyimide, polyester, or polyethylene naphthalate. In the embodiment shown, the insulating layers 34' and 35' are each provided at outer side of the pads 15a and 17a in the width direction so as to extend from near side position of the pads 17a of the rear array 17 to the front side end position of the connection end portion 13 and to surround engageable part 28, 29. The insulating layers 34' and 35' may also be provided only to cover the reinforcement layers 31 and 32.

According to such a flexible printed wiring board 1, an advantage is obtained that a wide space for mounting can be ensured when other electronic components such as chips are mounted on the top surface side. Moreover, the reinforcement layers 31 and 32 can enhance the disconnection resistance of the flexible printed wiring board 1. In addition, the insulating layers 34' and 35' can insulate the reinforcement layers 31 and 32 from the engagement pars of another electronic component. Therefore, even when the engagement parts of the other electronic component are connected to ground, the pads 15a for signals can be prevented from short-circuiting with the ground via the reinforcement layers 31 and 32 and the engagement parts of the other electronic component. Furthermore, such insulating layers 34' and 35' also serve as reinforcement members that enhance the strength around the engageable parts 28 and 29, and can further enhance the disconnection resistance of the flexible printed wiring board 1.

Next, as shown in FIG. 17 which shows a flexible printed wiring board according to yet another embodiment of the present invention, the flexible printed wiring board 1 of FIG. 17 is configured such that both of the first wirings 9 connected to the pads 15a of the front array 15 and the second wirings 11 connected to the pads 17a of the rear array 17 are disposed on the other surface (back surface) of the base film 3, and the flexible printed wiring board 1 has reinforcement layers 31''' and 32''', but the flexible printed wiring board 1 of FIG. 17 is different from the flexible printed wiring board 1 of FIG. 15 in an aspect that the flexible printed wiring board 1 does not have an upper surface side coverlay.

In more detail, the reinforcement layers 31''' and 32''' can be formed of an insulating resin, e.g., polyimide, polyester, or polyethylene naphthalate. In the embodiment shown, the reinforcement layers 31''' and 32''' are each provided at outer side of the pads 15a and 17a in the width direction so as to extend from near side position of the pads 17a of the rear array 17 to the front side end position of the connection end portion 13 and to surround the engageable part 28, 29. The reinforcement layers 31''' and 32''' can also be provided only at frontward side parts with respect to the engageable parts 28 and 29 when viewed in the direction of connection with another electronic component.

According to such a flexible printed wiring board 1, the reinforcement layers 31''' and 32''' can enhance the disconnection resistance of the flexible printed wiring board 1. In addition, even when the engagement parts of the other electronic component are connected to ground, the pads 15a for signals can be prevented from short-circuiting with the ground via the reinforcement layers 31''' and 32''' and the engagement parts of the other electronic component.

Several embodiments of the flexible printed wiring boards according to the present invention have been described hereinbefore, but the present invention is not limited to these embodiments, and various modifications are possible. For example, although not shown, in the flexible printed wiring boards 1 of the above-described embodiments, one or more reinforcement layers like those at the top surface side may be provided at the back surface side of the base film 3. According to such a configuration, the disconnection resistance of the flexible printed wiring board 1 can be furthermore enhanced.

(Connector)

The description will then be directed to a connector according to an embodiment of the present invention which connects the above-described flexible printed wiring board 1 to another wiring board.

As shown in FIG. 18, connector 50 comprises: a housing 52 into which the flexible printed wiring board 1 is inserted; a plurality of contacts 54 that are to be electrically connected with the pads 15a and 17a of the flexible printed wiring board 1; a rotative member 56, as an operative member, that presses, via the contacts 54, the flexible printed wiring board 1 inserted in the housing 52; and tab-like lock members (see FIG. 20), as engagement parts, that engage with the engageable parts 28 and 29 provided at both side edge parts of the connection end portion 13 of the flexible printed wiring board 1.

The housing 52 is formed of electrically insulating plastic and can be manufactured using a known injection molding method. The material may be appropriately selected in consideration of the dimensional stability, workability, cost, and the like. Examples of the material include in general polybutylene terephthalate (PBT), polyamide (66PA, 46PA), liquid crystal polymer (LCP), polycarbonate (PC), polytetrafluoroethylene (PTFE), and composite material thereof.

The housing 52 is provided with a required number of insertion channels in which the contacts 54 are inserted, and the rearward side of the housing 52 is provided with an insertion opening 60 into which the flexible printed wiring board 1 is inserted.

The contacts 54 can be manufactured using a known working method, such as press work and cutting work. The contacts 54, for which spring property, conductivity and other appropriate properties are required, can be formed of brass, beryllium copper, phosphor bronze, or the like. As shown in FIGS. 19(a) and 19(b), two types of the contacts 54 are used, including those corresponding to the pads 15a of the front array 15 of the flexible printed wiring board 1 and those corresponding to the pads 17a of the rear array 17, which are provided in a staggered arrangement such that the insertion positions are staggered. The two types of contacts 54a and 54b have respective H-shaped figures that are substantially formed with rearward side openings 62 and 63 into which the connection end portion 13 of the flexible printed wiring board 1 is inserted and frontward side openings 67 and 68 into which a cam of the rotative member 56 to be described later is inserted. Likewise, the lock members 58 have H-shaped figures, as shown in FIG. 20, that are substantially formed with rearward side openings 58a into which the connection end portion 13 of the flexible printed wiring board 1 is inserted and frontward side openings 58b into which the cam 65 of the rotative member 56 to be described later is inserted. The lock members 58 are disposed at both sides of the set of contacts 54.

As shown in FIG. 21, the rotative member 56 is rotatably supported at its both ends by the housing 52 around a rotation axis in the width direction W. The rotative member 56 has a cam 65, on the rotation axis, that is inserted into the above-described frontward side openings 67 and 68 of the contacts 54 and into the frontward side openings 58b of the lock members 58. After the flexible printed wiring board 1 is inserted in the insertion opening 60 of the housing 52, the rotative member 56 is rotated toward the direction of lying to actuate the cam 65 so that the frontward side openings 67 and 68 of the contacts 54 and the frontward side openings 58b of the lock members 58 are expanded against the spring forces of the contacts 54 and the lock members 58. Through this operation, as shown in FIG. 20, the rearward side openings 62 and 63 of the contacts 54 and the rearward side openings 58a of the lock members 58 are narrowed, and the electric connection between the contacts 54 and the flexible printed wiring board 1 and the engagement of the lock members 58 with the engageable parts 28 and 29 are achieved. In contrast, when the rotative member 56 is rotated toward the direction of standing as shown in FIG. 21, the electric connection and the engagement of the lock members 58 are released.

The operating member may be, other than the rotative member 56 as described above, a slider that is inserted into the housing to press the flexible printed wiring board to the contacts after the printed wiring board is inserted in the housing. Specifically, a connector 70 as shown in FIG. 22 and FIG. 23 may be configured to mainly comprise a housing 72, contacts 74, and a slider 76. The contacts 74 have substantially C-shaped figures, as shown in FIG. 23, and are each mainly configured of a contacting part 74a that comes into contact with the flexible printed wiring board 1, a connecting part 74b that is connected with a substrate or the like, and a fixed part 74c that is fixed to the housing 72 such as by press fitting. The slider 76 has a substantially wedge-shaped figure, as shown in FIG. 23. After the flexible printed wiring board 1 is inserted in the housing 72 provided with a required number of the contacts 74, the slider 76 is inserted into the housing 72. Such a slider 76 mainly comprises mounted parts 76a that are mounted to the housing 72, and a pressing part 76b that presses the flexible printed wiring board 1 to the contacting parts 74a of the contacts 74. Before the flexible printed wiring board 1 is inserted, the slider 76 is in a state of being provisionally mounted to the housing 72. When the slider 76 is inserted after the flexible printed wiring board 1 is inserted, the pressing part 76b of the slider 76 is inserted parallel to the flexible printed wiring board 1, as shown in FIG. 23(b), and the flexible printed wiring board 1 comes to be pressed to the contacting parts 74a of the contacts 74. Although not shown, like the connector 50 of the previous embodiment, the connector 70 of the present embodiment also has engagement parts that, when the slider 76 is inserted, engage with the engageable parts 28 and 29 provided with the flexible printed wiring board 1.

In the connector 50 shown in FIGS. 18 to 21, the rotative member 56 has been exemplified as being disposed at a frontward position on the housing 52 with respect to the insertion direction, but the rotative member 56 may also be disposed at a rearward position on the housing 52 with respect to the insertion direction (not shown).

EXAMPLES

Tests for confirming the effects of the present invention were performed, which will be described below.

Example 1

As Example 1, a printed wiring board having the structure shown in FIGS. 1 to 4 was experimentally manufactured. Specifically, the flexible printed wiring board was manufactured such that: the connection end portion had pads disposed in a staggered arrangement to form 15 pads of the front array and 14 pads of the rear array; the pitch of the pads was 0.175 mm (0.35 mm in each array); both the wirings for the pads of the front array and the wirings for the pads of the rear array were provided on the surface (back surface) of the base film opposite to the surface provided with the pads; and reinforcement layers formed integrally with the pads were provided at the top surface side and at the frontward side with respect to notched parts (engageable parts). In addition, insulating layers were formed on the upper surfaces of the reinforcement layers using extended parts of an upper surface side coverlay. The pads, wirings and reinforcement layers were made of copper, and gold plated layers were formed on the top surfaces of the pads. A polyimide film having a thickness of 20 μm was used as the base film. Polyimide films having a thickness of 12.5 μm were used as the upper surface side coverlay and the lower surface side coverlay. A polyimide film having a thickness of 12.5 μm was used as the reinforcement film. The reinforcement layers were made to have a width of 0.5 mm, a length of 0.5 mm, and a thickness of 22.5 μm (copper: 12.5 μm, plated copper: 10 μm, the same as those of the wirings). The notched parts were made to have dimensions of a width of 0.5 mm and a length of 0.5 mm.

Example 2

As Example 2, a printed wiring board was experimentally manufactured as in Example 1 except that the reinforcement layers at the top surface side (the side provided with the pads) of the base film were formed separately from the pads as shown in FIG. 13 and insulating layers covering the reinforcement layers were not provided.

Example 3

As Example 3, a printed wiring board was experimentally manufactured as in Example 2 except that insulating layers covering the reinforcement layers were provided as shown in FIG. 14. In more detail, the flexible printed wiring board of Example 3 was manufactured such that the insulating layers covering the reinforcement layers were constituted of extended parts extending frontward from the outer side parts of the upper surface side coverlay in the width direction.

Example 4

As Example 4, a printed wiring board was experimentally manufactured as in Example 2 except that reinforcement layers as shown in FIG. 15 were provided, as substitute for the reinforcement layers of Example 2, at the upper surface side (the side formed with the pads) of the base film. In more detail, the printed wiring board of Example 4 was manufactured such that the reinforcement layers formed separately from the pads at the upper surface side were constituted of extended parts extending frontward from the outer side parts of the upper surface side coverlay in the width direction.

Comparative Example 1

As Comparative Example 1, a printed wiring board having the same structure as that of Example 1 was experimentally manufactured except that, as shown in FIG. 24, the above reinforcement layers and insulating layers were not provided.

(Test of Disconnection Resistance)

The test of disconnection resistance was performed through: connecting each of the flexible printed wiring boards of Examples 1 to 4 and Comparative Example 1 with a connector having the structure shown in FIG. 18 (but no contacts were provided); obtaining a state in which the printed wiring board was simply fitted with and held by the tab-like lock members; pulling the flexible printed wiring board from the connector in the direction of disconnection (opposite direction to the direction of connection) using a tensile tester; and measuring a load applied to the tensile tester when the printed wiring board was disconnected from the connector.

(Test Results)

Results of the test were as follows. Given that the load when the flexible printed wiring board of Comparative Example 1 was disconnected from the connector was represented by 100%, the load when the flexible printed wiring board was disconnected from the connector was 168% in Example 1, 146% in Example 2, 168% in Example 3, and 115% in Example 4. It has thus been confirmed that the disconnection resistance of the flexible printed wiring board is improved by applying the present invention.

INDUSTRIAL APPLICABILITY

As described above, according to the present invention, it is possible to provide a printed wiring board that exhibits excellent disconnection resistance.

DESCRIPTION OF REFERENCE NUMERALS

1 . . . Flexible printed wiring board
3 . . . Base film
4 . . . Adhesive layer
5 . . . Upper surface side coverlay
6 . . . Adhesive layer
7 . . . Lower surface side coverlay
9, 11 . . . Wiring
13 . . . Connection end portion
15a . . . Pads of front array
17a . . . Pads of rear array
18, 19 . . . Plated layer
21 . . . Adhesive layer
23 . . . Reinforcement film
24, 25 . . . Via
28, 29 . . . Engageable part
31, 32 . . . Reinforcement layer
31', 32' . . . Reinforcement layer
31", 32" . . . Reinforcement layer
31''', 32''' . . . Reinforcement layer
34, 35 . . . Insulating layer
34', 35' . . . Insulating layer
36, 37 . . . Copper foil
39 . . . Double-sided copper clad laminate
41, 42 . . . Blind via hole
50 . . . Connector
52 . . . Housing
54 . . . Contact
56 . . . Rotative member (operative member)
58 . . . Lock member (engagement part)
65 . . . Cam
70 . . . Connector
72 . . . Housing
74 . . . Contact
76 . . . Slider

The invention claimed is:

1. A printed wiring board to be connected with an engagement part of a connector connected to ground, the printed wiring board comprising:
   a base substrate;
   a plurality of pads for electrical connection that are disposed at one surface side of the base substrate and at a connection end portion to be connected with the connector;
   wirings that are connected with the pads;
   an engageable part that is formed at a side edge part of the connection end portion and is to be engaged with the engagement part of the connector in a direction of disconnection;
   a reinforcement layer that is disposed at the one surface side of the base substrate and at a frontward side with respect to the engageable part when viewed in a direction of connection with the connector, and that is formed integrally with at least any one of the pads and wirings; and
   an insulating layer that covers a surface of the reinforcement layer, wherein
   the insulating layer is disposed at outer side of the pads in the width direction and from a side position of the pads to the front side end position of the connection end portion so as not to cover the pads.

2. A connector connecting the printed wiring board according to claim 1 with another wiring board, the connector comprising:
   a housing that has an insertion opening into which the connection end portion of the printed wiring board is inserted;
   a plurality of contacts that are provided to correspond to the plurality of pads of the printed wiring board inserted in the housing; and
   the engagement part that engages with the engageable part provided with the printed wiring board in the direction of disconnection of the printed wiring board.

* * * * *